(12) United States Patent
Cho et al.

(10) Patent No.: US 11,616,112 B2
(45) Date of Patent: Mar. 28, 2023

(54) DISPLAY APPARATUS INCLUDING POWER SUPPLY WIRES INHABITING NON-DISPLAY AREA

(71) Applicant: Samsung Display Co., Ltd., Yongin-si (KR)

(72) Inventors: Young Jin Cho, Seoul (KR); Joong-Soo Moon, Hwaseong-si (KR); Yang Wan Kim, Hwaseong-si (KR); Soon Jung Wang, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 162 days.

(21) Appl. No.: 16/952,001

(22) Filed: Nov. 18, 2020

(65) Prior Publication Data
US 2021/0159301 A1 May 27, 2021

(30) Foreign Application Priority Data
Nov. 22, 2019 (KR) ........................ 10-2019-0151695

(51) Int. Cl.
*H01L 27/14* (2006.01)
*H01L 27/32* (2006.01)
*H01L 51/50* (2006.01)
*H01L 51/52* (2006.01)
*H01L 27/146* (2006.01)

(52) U.S. Cl.
CPC ........ *H01L 27/3276* (2013.01); *H01L 27/323* (2013.01); *H01L 27/3246* (2013.01); *H01L 51/5253* (2013.01); *G09G 2300/0408* (2013.01); *G09G 2300/0804* (2013.01); *H01L 27/14678* (2013.01); *H01L 27/3211* (2013.01);
(Continued)

(58) Field of Classification Search
CPC ............... H01L 27/3276; H01L 27/323; H01L 27/3246; H01L 27/3258; H01L 27/3244; H01L 27/3262; H01L 27/3295; H01L 27/3211; H01L 27/14678; H01L 51/5253; H01L 51/5088; H01L 51/5092;
(Continued)

(56) References Cited

U.S. PATENT DOCUMENTS 9,905,628 B2 2/2018 Kao et al.
10,170,534 B1 * 1/2019 Kim .................... H01L 27/3223
(Continued)

FOREIGN PATENT DOCUMENTS

KR 10-1335920 B1 12/2013
KR 10-2017-0015629 A 2/2017
(Continued)

*Primary Examiner* — Ida M Soward
(74) *Attorney, Agent, or Firm* — Lewis Roca Rothgerber Christie LLP

(57) ABSTRACT

A display apparatus includes: a base substrate including a display area and a non-display area adjacent to the display area; a first power supply wire in the non-display area, a first power supply voltage being applied to the first power supply wire; a second power supply wire in the non-display area and spaced apart from the first power supply wire, a second power supply voltage being applied to the second power supply wire; and a dam overlapping the first power supply wire and the second power supply wire, having a first height on the first power supply wire, and having a second height greater than the first height between the first power supply wire and the second power supply wire.

17 Claims, 19 Drawing Sheets

(52) U.S. Cl.
CPC ...... *H01L 51/5056* (2013.01); *H01L 51/5072* (2013.01); *H01L 51/5088* (2013.01); *H01L 51/5092* (2013.01); *H01L 2251/301* (2013.01)

(58) Field of Classification Search
CPC ............. H01L 51/5056; H01L 51/5072; H01L 2251/301; G09G 2300/0408; G09G 2300/0804
See application file for complete search history.

(56) References Cited

U.S. PATENT DOCUMENTS

| | | | |
|---|---|---|---|
| 10,347,866 B1* | 7/2019 | Kim | H01L 27/3223 |
| 10,903,294 B2* | 1/2021 | Bang | H01L 27/3276 |
| 2019/0057632 A1* | 2/2019 | Kim | G09G 3/3225 |
| 2019/0187849 A1* | 6/2019 | Lee | G06F 3/0412 |
| 2019/0220123 A1* | 7/2019 | Kanaya | G06F 3/04164 |
| 2019/0237533 A1* | 8/2019 | Kim | G09G 3/3266 |
| 2020/0006452 A1* | 1/2020 | Lee | H01L 27/0288 |
| 2020/0105840 A1* | 4/2020 | Choi | G06F 3/04164 |
| 2020/0185647 A1* | 6/2020 | Lee | H01L 27/3246 |
| 2020/0235180 A1* | 7/2020 | Park | H01L 27/3276 |
| 2021/0225992 A1* | 7/2021 | Long | H01L 27/20 |
| 2021/0335948 A1* | 10/2021 | Choi | H01L 27/3258 |

FOREIGN PATENT DOCUMENTS

| | | |
|---|---|---|
| KR | 10-2018-0060851 A | 6/2018 |
| KR | 10-2019-0077870 A | 7/2019 |

* cited by examiner

FIG. 5
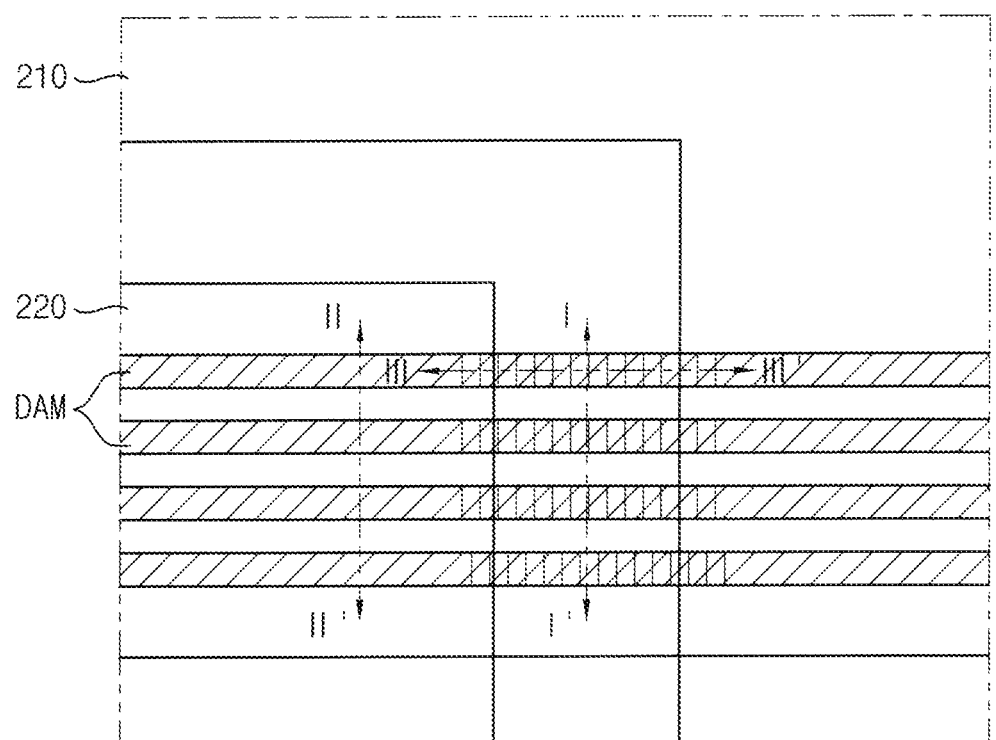
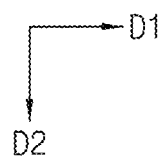

FIG. 8
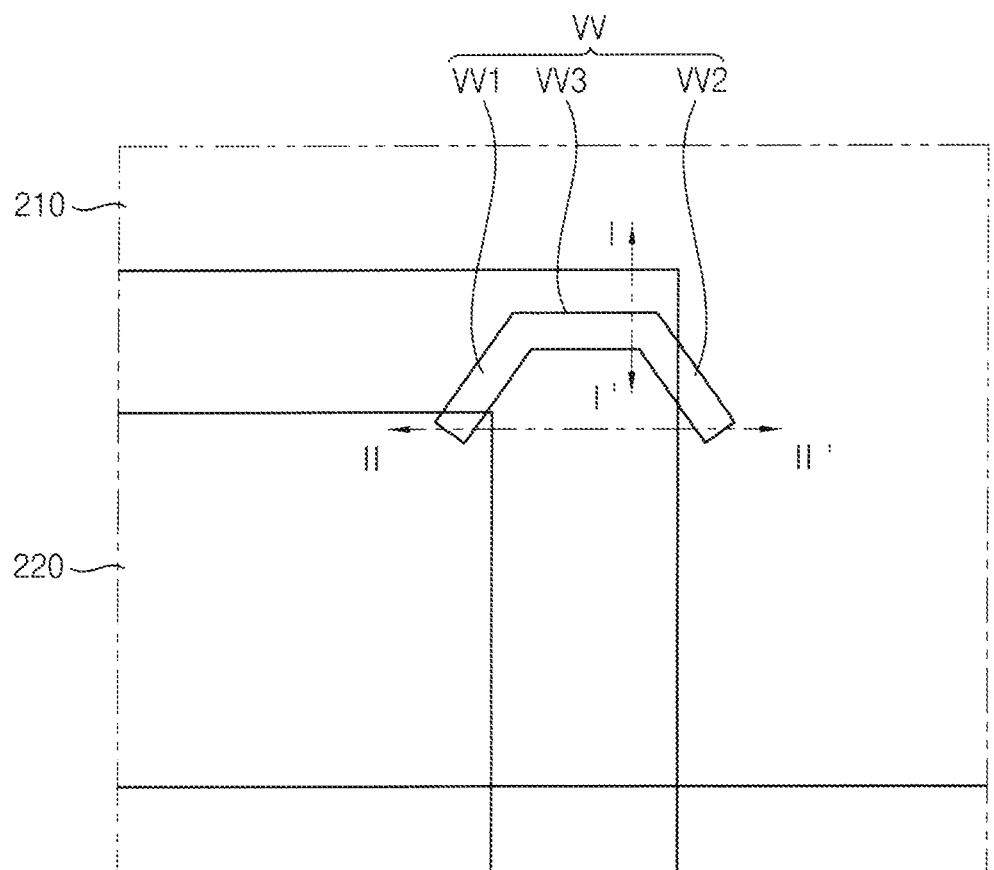
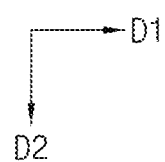

FIG. 13
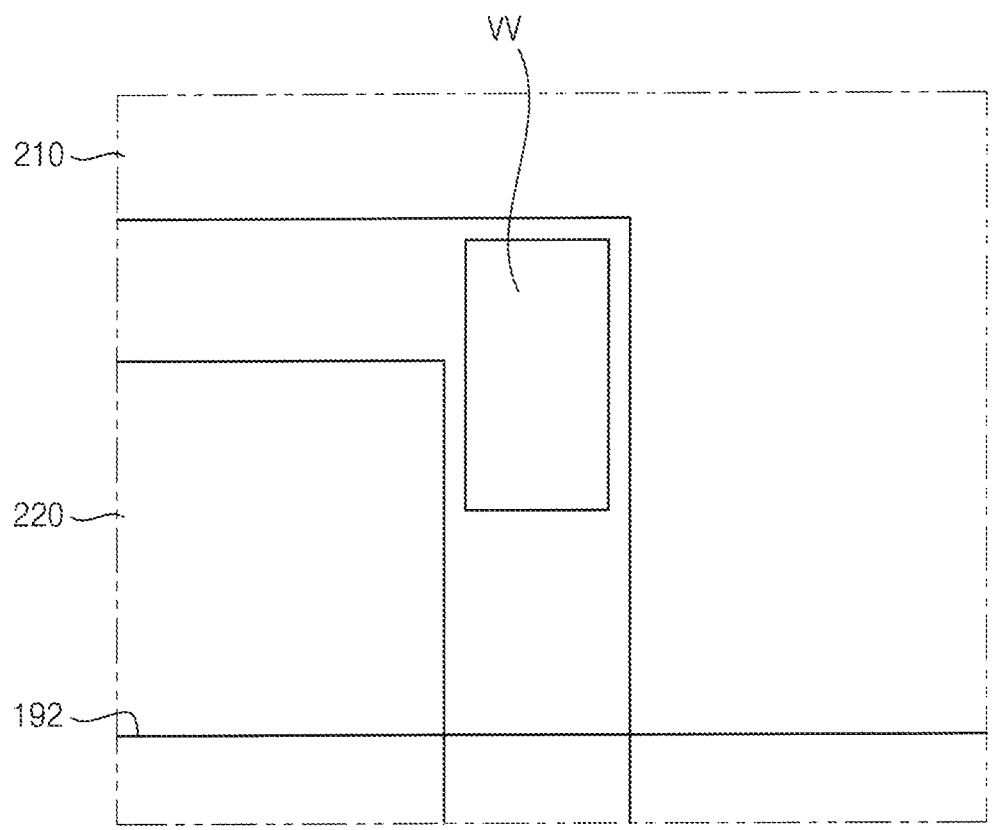
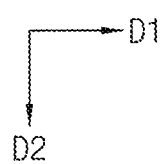

FIG. 17
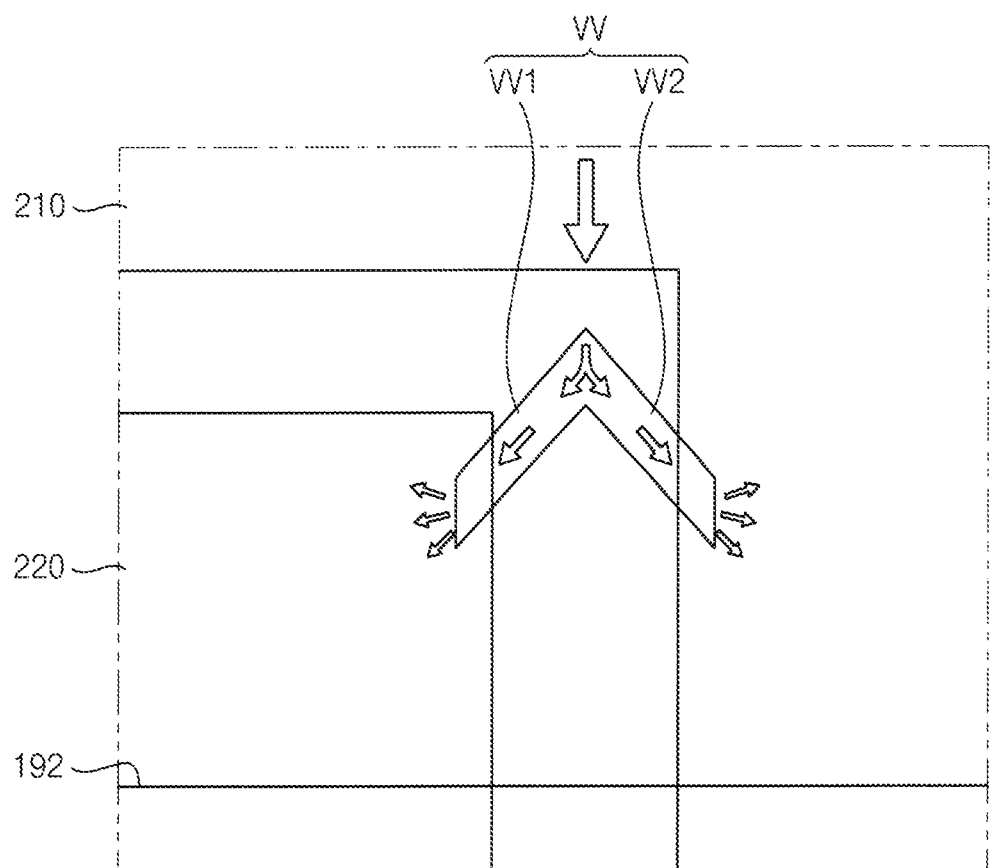
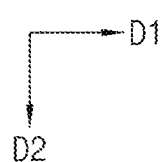

DISPLAY APPARATUS INCLUDING POWER SUPPLY WIRES INHABITING NON-DISPLAY AREA

CROSS-REFERENCE TO RELATED APPLICATION

The present application claims priority to and the benefit of Korean Patent Application No. 10-2019-0151695 filed on Nov. 22, 2019 in the Korean Intellectual Property Office (KIPO), the entire disclosure of which is incorporated herein by reference.

BACKGROUND

1. Field

Aspects of some example embodiments relate generally to a display apparatus.

2. Description of the Related Art

Recently, as the technology improves, display products having smaller sizes, lighter weights, and superior performance have been produced. Cathode ray tube (CRT) televisions have been widely used for display apparatuses with many advantages in terms of performance and price. Recently, however, display apparatuses such as plasma display apparatuses, liquid crystal display apparatuses, and organic light emitting diode display apparatuses have become utilized more frequently due to their relatively smaller thicknesses, lighter weight, and lower power consumption compared to CRT displays.

A display apparatus may include an internal structure sealed by a thin film encapsulation layer, and a touch screen panel formed on the thin film encapsulation layer. For example, an organic light emitting diode display apparatus may have a thin film encapsulation layer and a structure in which a touch screen panel is directly formed on the thin film encapsulation layer. In this case, the quality of the thin film encapsulation layer may affect display quality and quality of the touch screen panel.

The above information disclosed in this Background section is only for enhancement of understanding of the background and therefore the information discussed in this Background section does not necessarily constitute prior art.

SUMMARY

Aspects of some example embodiments relate generally to a display apparatus. For example, some example embodiments of the present inventive concept relate to a display apparatus with relatively improved display quality.

Aspects of some example embodiments include a display apparatus in which a thin film encapsulation layer with relatively improved quality, so that display quality and quality of a touch screen panel layer may be improved.

According to some example embodiments, a display apparatus may include a base substrate including a display area and a non-display area adjacent to the display area, a first power supply wire in the non-display area, a first power supply voltage being applied to the first power supply wire, a second power supply wire in the non-display area and spaced apart from the first power supply wire, a second power supply voltage being applied to the second power supply wire, and a dam overlapping the first power supply wire and the second power supply wire, having a first height on the first power supply wire, and having a second height greater than the first height between the first power supply wire and the second power supply wire.

According to some example embodiments, the dam may include a first dam layer and a second dam layer on the first dam layer. In addition, the first dam layer may be formed between the first power supply wire and the second power supply wire, and on the first power supply wire and the second power supply wire. Further, the second dam layer may be formed between the first power supply wire and the second power supply wire.

According to some example embodiments, both ends of the second dam layer of the dam may overlap the first power supply wire and the second power supply wire.

According to some example embodiments, the display apparatus may further include a pixel defining layer on the base substrate to define an opening, a light emitting layer in the opening, and a thin film encapsulation layer on the light emitting layer. In addition, the first dam layer of the dam may be on a same layer as the pixel defining layer.

According to some example embodiments, the display apparatus may further include a spacer on the pixel defining layer. In addition, the second dam layer of the dam may be on a same layer as the spacer.

According to some example embodiments, the display apparatus may further include a via insulating layer on the first power supply wire and the second power supply wire. In addition, a height from the base substrate to a top surface of the via insulating layer may be lower in a region between the first power supply wire and the second power supply wire than in a region overlapping the first or second power supply wire.

According to some example embodiments, each of the first power supply wire and the second power supply wire may include at least two conductive layers, and an insulating layer may be between the conductive layers.

According to some example embodiments, the display apparatus may further include a first inorganic layer on the dam, an organic layer on the first inorganic layer, and a second inorganic layer on the organic layer.

According to some example embodiments, the display apparatus may further include a via insulating layer having a recessed portion formed between the first power supply wire and the second power supply wire.

According to some example embodiments, the display apparatus may further include a thin film transistor layer on the base substrate and including a thin film transistor, a light emitting structure electrically connected to the thin film transistor, a thin film encapsulation layer which covers the light emitting structure, and a touch screen panel layer on the thin film encapsulation layer to detect a touch input of a user.

According to some example embodiments, a display apparatus may include a base substrate including a display area and a non-display area adjacent to the display area, a first power supply wire in the non-display area, a first power supply voltage being applied to the first power supply wire, a second power supply wire in the non-display area and spaced apart from the first power supply wire, a second power supply voltage being applied to the second power supply wire, and an insulating layer having a recessed portion formed between the first power supply wire and the second power supply wire.

According to some example embodiments, the recessed portion may include a first portion at least partially overlapping the first power supply wire and a second portion at least partially overlapping the second power supply wire.

According to some example embodiments, the first power supply wire and the second power supply wire may be spaced apart from each other in a first direction and may extend in a second direction perpendicular to the first direction. In addition, the first portion and the second portion of the recessed portion may extend in directions inclined with respect to the first direction and the second direction, respectively.

According to some example embodiments, the first power supply wire and the second power supply wire may be spaced apart from each other in a first direction and may extend in a second direction perpendicular to the first direction. In addition, the recessed portion may extend in the second direction between the first power supply wire and the second power supply wire.

According to some example embodiments, the display apparatus may further include a thin film transistor layer on the base substrate and including a thin film transistor. In addition, a height from a top surface of the thin film transistor layer to a top surface of the insulating layer in which the recessed portion is formed may be lower in a region between the first power supply wire and the second power supply wire than in a region overlapping the first or second power supply wire.

According to some example embodiments, the insulating layer may include a first via insulating layer and a second via insulating layer on the first via insulating layer. In addition, the first via insulating layer or the second via insulating layer may not be formed in the recessed portion.

According to some example embodiments, the display apparatus may further include a first inorganic layer on the insulating layer, an organic layer on the first inorganic layer, and a second inorganic layer on the organic layer.

According to some example embodiments, the display apparatus may further include a thin film transistor layer on the base substrate and including a thin film transistor, a light emitting structure electrically connected to the thin film transistor, a thin film encapsulation layer which covers the light emitting structure, and a touch screen panel layer on the thin film encapsulation layer to detect a touch input of a user.

According to some example embodiments, the display apparatus may further include a dam on the insulating layer to overlap the first power supply wire and the second power supply wire.

According to some example embodiments, the dam may have a first height on the first power supply wire, and may have a second height greater than the first height between the first power supply wire and the second power supply wire.

Therefore, a display apparatus according to some example embodiments may include a dam overlapping a first power supply wire and a second power supply wire, having a first height on the first power supply wire, and having a second height greater than the first height between the first power supply wire and the second power supply wire or may include an insulating layer having a recessed portion formed between the first power supply wire and the second power supply wire. Accordingly, an organic layer of the thin film encapsulation layer may be relatively uniformly formed, so that display quality and quality of the touch screen panel layer may be improved.

BRIEF DESCRIPTION OF THE DRAWINGS

FIG. 5 is an enlarged view showing the area 'A' in FIG. 3.

FIG. 8 is a partially enlarged view showing a display apparatus according to some example embodiments.

FIG. 13 is a partially enlarged view showing a display apparatus according to some example embodiments.

FIG. 17 is a diagram illustrating a flow of an organic layer of a thin film encapsulation layer of the display apparatus of FIG. 12.

DETAILED DESCRIPTION

Hereinafter, further details of some example embodiments of the present inventive concept will be explained in more detail with reference to the accompanying drawings.

Figure 1:
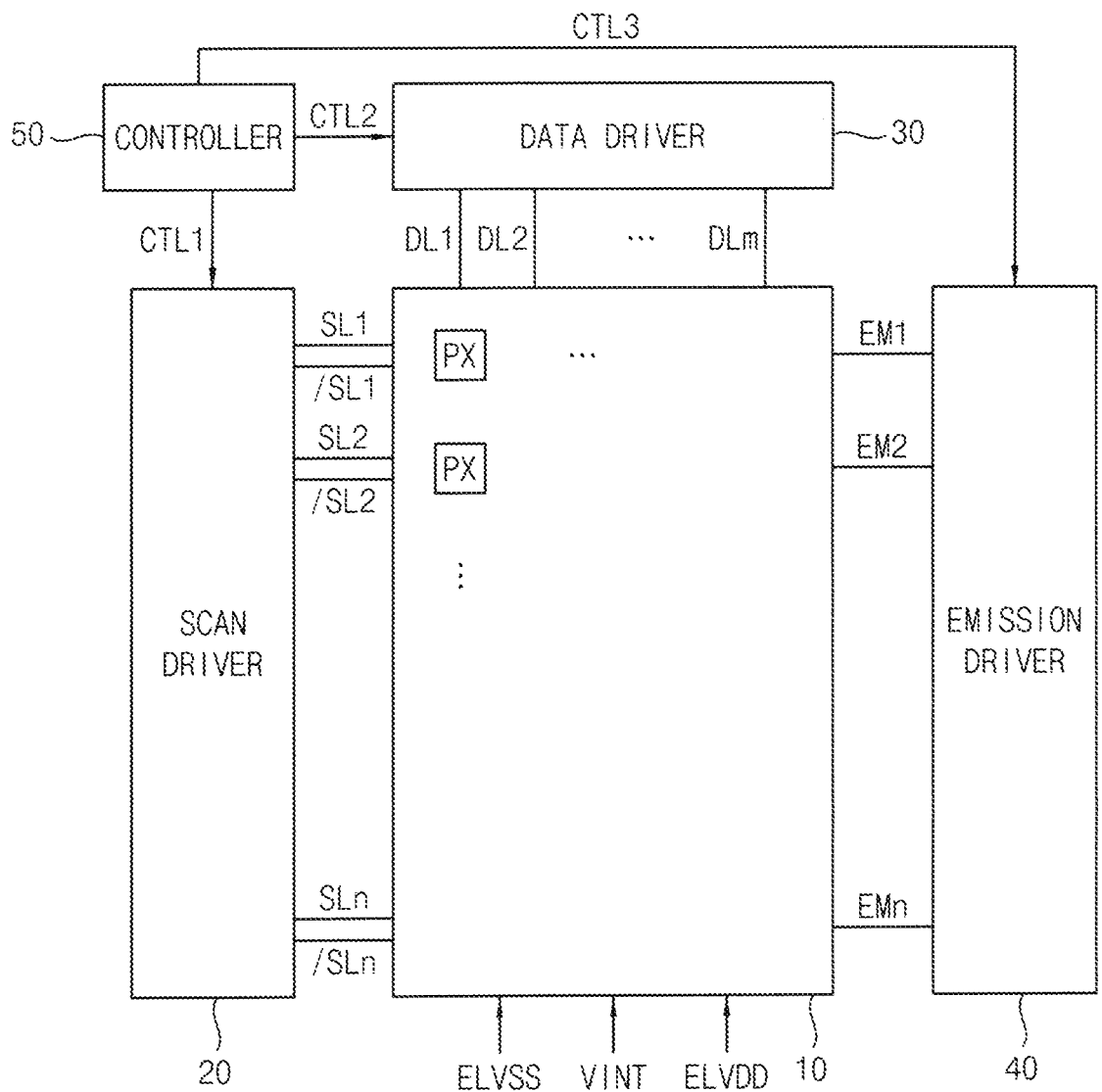
FIG. 1 is a block diagram illustrating a display apparatus according to some example embodiments.

FIG. 1 is a block diagram illustrating a display apparatus according to some example embodiments.

Referring to FIG. 1, a display apparatus may include a display panel 10, a scan driver 20, a data driver 30, an emission control driver 40, and a controller 50.

The display panel 10 may include a plurality of pixels PX for displaying an image. For example, the display panel 10 may include n*m pixels PX (e.g., arranged in a matrix) located at intersecting portions of scan lines SL1 to SLn and data lines DL1 to DLm (where each of n and m is an integer greater than 1). An example structure of the pixel PX will be described in more detail below with reference to FIG. 2.

The scan driver 20 may sequentially provide a first scan signal to the pixels PX through the scan lines SL1 to SLn and sequentially provide a second scan signal to the pixels PX through inverted scan lines /SL1 to /SLn. For example, the second scan signal may be an inverted signal of the first scan signal based on a first control signal CTL1.

The data driver 30 may provide a data signal to the pixels PX through the data lines DL1 to DLm based on a second control signal CTL2.

The emission control driver 40 may sequentially provide an emission control signal to the pixels PX through emission control lines EM1 to EMn based on a third control signal CTL3.

The controller 50 may control the scan driver 20, the data driver 30, and the emission control driver 40. The controller 50 may generate the control signals CTL1 to CTL3 to control the scan driver 20, the data driver 30, and the emission control driver 40. The first control signal CTL1 for controlling the scan driver 20 may include a scan start signal, a scan clock signal, and the like. The second control signal CTL2 for controlling the data driver 30 may include image data, a horizontal start signal, and the like. The third control signal CTL3 for controlling the emission control driver 40 may include an emission control start signal, an emission control clock signal, and the like.

In addition, the display apparatus may further include a power supply unit configured to supply a first power supply voltage ELVDD, a second power supply voltage ELVSS, and an initialization voltage VINT to the display panel 10.

Figure 2:
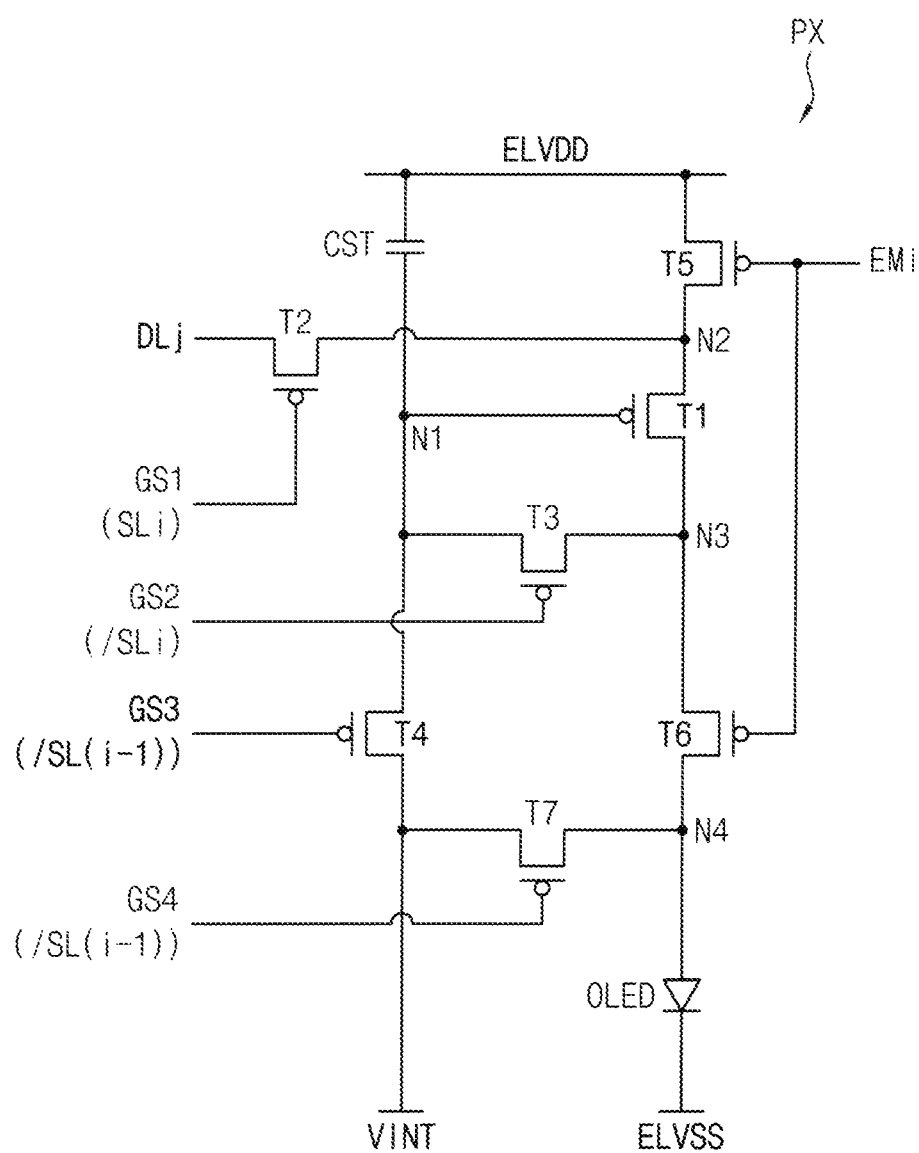
FIG. 2 is an equivalent circuit diagram illustrating an example of a pixel included in the display apparatus of FIG. 1.

FIG. 2 is an equivalent circuit diagram illustrating an example of a pixel included in the display apparatus of FIG. 1.

Referring to FIG. 2, the pixel PX may include first to seventh transistors T1 to T7, a storage capacitor CST, and an organic light emitting diode OLED. The pixel PX may be located in an $i^{th}$ pixel row (where i is an integer between 1 and n) and a $j^{th}$ pixel column (where j is an integer between 1 and m).

The first transistor T1 may be a driving transistor configured to provide a driving current corresponding to the data signal to the organic light emitting diode OLED. The first transistor T1 may include a gate electrode connected to a first node N1, a first electrode connected to a second node N2, and a second electrode connected to a third node N3.

The second transistor T2 may provide the data signal to the first transistor T1 in response to a first scan signal GS1. According to some example embodiments, the second transistor T2 may include a gate electrode configured to receive the first scan signal GS1 from an $i^{th}$ scan line SLi, a first electrode configured to receive the data signal from a $j^{th}$ data line DLj, and a second electrode connected to the first electrode of the first transistor T1 (i.e., the second node N2).

The third transistor T3 may connect the second electrode of the first transistor T1 to the gate electrode of the first transistor T1 in response to a second scan signal GS2. According to some example embodiments, the third transistor T3 may include a gate electrode configured to receive the second scan signal GS2 from an $i^{th}$ inverted scan line /SLi, a first electrode connected to the second electrode of the first transistor T1 (i.e., the third node N3), and a second electrode connected to the gate electrode of the first transistor T1 (i.e., the first node N1).

The fourth transistor T4 may apply the initialization voltage VINT to the gate electrode of the first transistor T1 in response to a third scan signal GS3. According to some example embodiments, the fourth transistor T4 may include a gate electrode configured to receive the third scan signal GS3 from an $(i-1)^{th}$ inverted scan line /SL(i-1), a first electrode connected to the initialization voltage VINT, and a second electrode connected to the gate electrode of the first transistor T1 (i.e., the first node N1).

The fifth transistor T5 may apply the first power supply voltage ELVDD to the first electrode of the first transistor T1 in response to the emission control signal. According to some example embodiments, the fifth transistor T5 may include a gate electrode configured to receive the emission control signal from an $i^{th}$ emission control line EMi, a first electrode connected to the first power supply voltage ELVDD, and a second electrode connected to the first electrode of the first transistor T1 (i.e., the second node N2).

The sixth transistor T6 may connect the second electrode of the first transistor T1 to a first electrode of the organic light emitting diode OLED in response to the emission control signal. According to some example embodiments, the sixth transistor T6 may include a gate electrode configured to receive the emission control signal from the $i^{th}$ emission control line EMi, a first electrode connected to the second electrode of the first transistor T1 (i.e., the third node N3), and a second electrode connected to the first electrode of the organic light emitting diode OLED (i.e., a fourth node N4).

The seventh transistor T7 may apply the initialization voltage VINT to the first electrode of the organic light emitting diode OLED in response to a fourth scan signal GS4. According to some example embodiments, the seventh transistor T7 may include a gate electrode configured to receive the fourth scan signal GS4 from the $(i-1)^{th}$ inverted scan line /SL(i-1), a first electrode connected to the initialization voltage VINT, and a second electrode connected to the first electrode of the organic light emitting diode OLED (i.e., the fourth node N4).

In this case, each of the first transistor T1, the second transistor T2, the fifth transistor T5, and the sixth transistor T6 may be a polysilicon (poly-Si) thin film transistor, and may be a P-type transistor. Each of the third transistor T3, the fourth transistor T4, and the seventh transistor T7 may be an oxide thin film transistor, and may be an N-type transistor.

The storage capacitor CST may include a first electrode connected to the first power supply voltage ELVDD, and a second electrode connected to the gate electrode of the first transistor T1 (i.e., the first node N1).

Figure 3:
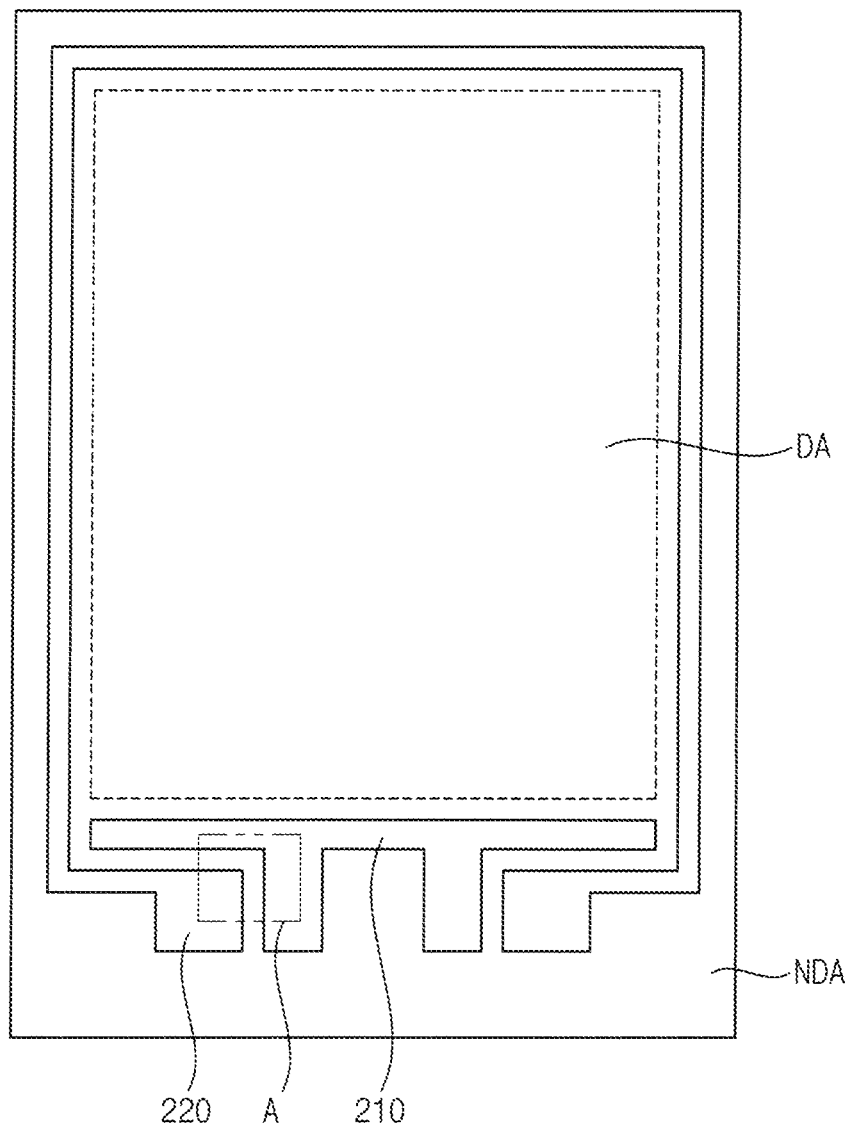
FIG. 3 is a plan view showing a display apparatus according to some example embodiments.

FIG. 3 is a plan view showing a display apparatus according to some example embodiments.

Referring to FIG. 3, a display apparatus may include a display area DA for displaying an image and a non-display area NDA surrounding the display area DA while being adjacent to the display area DA. The display apparatus may include a first power supply wire 210 and a second power supply wire 220.

The display area DA may be located on a plane configured in a first direction D1 and a second direction D2 perpendicular to the first direction D1. A plurality of pixels for displaying an image may be located in the display area DA, and the first power supply wire 210 and the second power supply wire 220 may be located in the non-display area NDA (e.g., around a periphery or outside a footprint of the display area DA).

The first power supply voltage ELVDD may be applied to the first power supply wire 210. The second power supply voltage ELVSS may be applied to the second power supply wire 220. A horizontal portion of the first power supply wire 210 may extend in the first direction D1, and may be adjacent to the display area DA. A vertical portion of the first power supply wire 210 may extend from the horizontal portion of the first power supply wire 210 in the second direction D2. The second power supply wire 220 may extend to surround the display area DA, and may be spaced apart from the first power supply wire 210.

Figure 4:
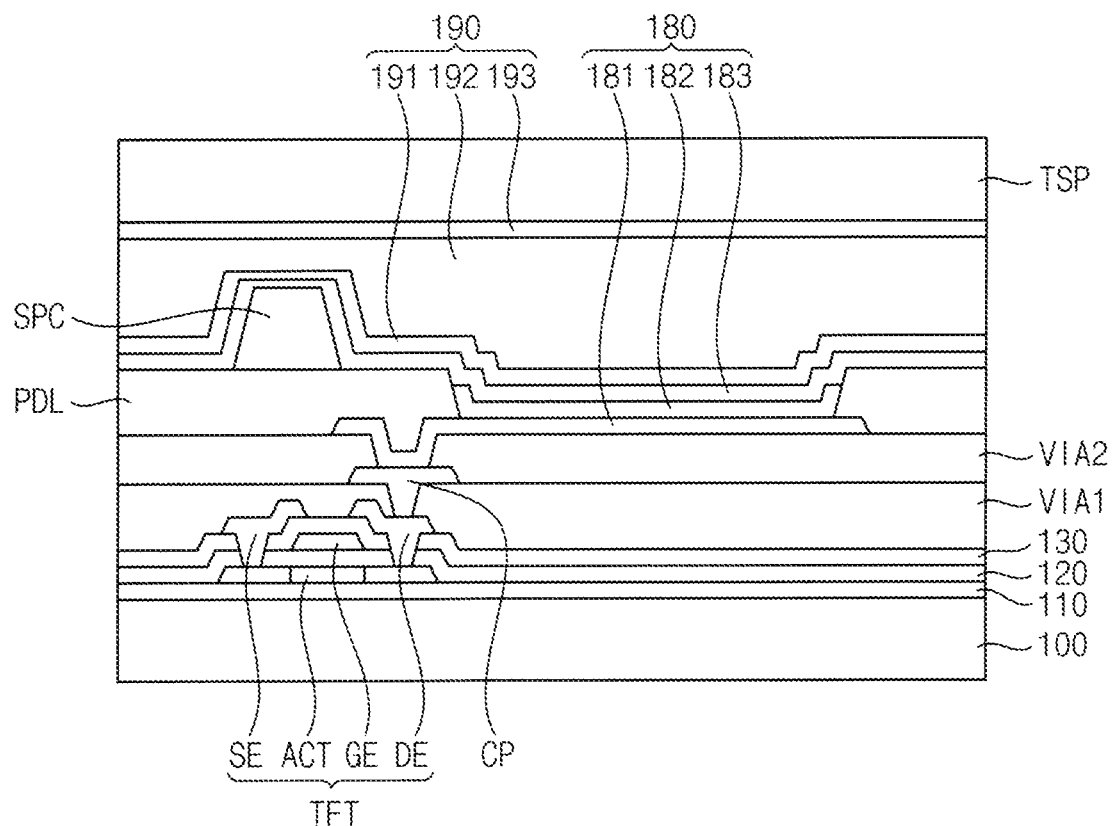
FIG. 4 is a sectional view corresponding to a pixel in a display area of the display apparatus of FIG. 3.

FIG. 4 is a sectional view corresponding to a pixel in a display area of the display apparatus of FIG. 3.

Referring to FIG. 4, the display apparatus may include a base substrate 100, a buffer layer 110, an active pattern ACT of a thin film transistor TFT, a first insulating layer 120, a gate conductive layer, a second insulating layer 130, a first source-drain conductive layer, a first via insulating layer VIA1, a second source-drain conductive layer, a second via insulating layer VIA2, a light emitting structure 180, a pixel definition layer PDL, a spacer SPC, a thin film encapsulation layer 190, and a touch screen panel layer TSP.

The base substrate 100 may be formed of a transparent or opaque material. For example, the base substrate 100 may include a quartz substrate, a synthetic quartz substrate, a calcium fluoride substrate, a fluorine-doped quartz substrate (F-doped quartz substrate), a soda lime glass substrate, a non-alkali glass substrates, and the like. According to some example embodiments, the base substrate 100 may be a transparent resin substrate having flexibility. Examples of the transparent resin substrate that may be used as the base substrate 100 include a polyimide substrate.

The buffer layer 110 may be located over the whole base substrate 100. The buffer layer 110 may prevent or reduce instances of metal atoms or impurities diffusing from the base substrate 100 into the active pattern ACT, and may control a heat transfer rate during a crystallization process for forming the active pattern ACT to obtain a substantially uniform active pattern ACT. In addition, when a surface of the base substrate 100 is not uniform, the buffer layer may serve to improve the flatness of (e.g., planarize) the surface of the base substrate 100.

The active pattern ACT may be located on the buffer layer 110. The active pattern ACT may include a drain region and a source region which are doped with impurities, and a channel region located between the drain region and the source region. For example, the active pattern ACT may include poly crystal silicon.

The first insulating layer 120 may be located on the buffer layer 110 on which the active pattern ACT is located. The first insulating layer 120 may include an inorganic insulating material such as a silicon compound and metal oxide.

The gate conductive layer may be located on the first insulating layer 120. The gate conductive layer may include a gate electrode GE of the thin film transistor TFT, which overlaps the active pattern ACT. The gate conductive layer may further include a signal wire such as a scan line for driving the display apparatus.

The second insulating layer 130 may be located on the first insulating layer 120 on which the gate conductive layer is located. The second insulating layer 130 may include an inorganic insulating material such as a silicon compound and metal oxide.

The first source-drain conductive layer may be located on the second insulating layer 130. The first source-drain conductive layer may include a source electrode SE and a drain electrode DE of the thin film transistor TFT. The first source-drain conductive layer may further include a first layer (see 212 in FIG. 6C) of the first power supply wire (see 210 in FIG. 6C), and a first layer (see 222 in FIG. 6C) of the second power supply wire (see 220 of FIG. 6C).

The first via insulating layer VIA1 may be located on the second insulating layer 130 on which the first source-drain conductive layer is located. The first via insulating layer VIA1 may be formed by using an organic material such as a photoresist, an acryl-based resin, a polyimide-based resin, a polyamide-based resin, and a siloxane-based resin.

The second source-drain conductive layer may be located on the first via insulating layer VIA1. The second source-drain conductive layer may include a contact pad CP electrically connected to the thin film transistor TFT. The second source-drain conductive layer may include a second layer (see 214 in FIG. 6C) of the first power supply wire, and a second layer (see 224 in FIG. 6C) of the second power supply wire.

The second via insulating layer VIA2 may be located on the first via insulating layer VIA1 on which the second source-drain conductive layer is located. The second via insulating layer VIA2 may be formed by using an organic material such as a photoresist, an acryl-based resin, a polyimide-based resin, a polyimide-based resin, and a siloxane-based resin.

The light emitting structure 180 may include a first electrode 181, a light emitting layer 182, and a second electrode 183.

The first electrode 181 may be located on the second via insulating layer VIA2. Depending on a light emitting scheme of the display apparatus, the first electrode 181 may be formed by using a reflective material or a transmissive material. According to some example embodiments, the first electrode 181 may have a single-layer structure or a multi-layer structure including a metal film, an alloy film, a metal nitride film, a conductive metal oxide film, and/or a transparent conductive material film.

The pixel defining layer PDL may be located on the second via insulating layer VIA2 on which the first electrode 181 is located. The pixel defining layer PDL may be formed by using an organic material, an inorganic material, and the like. For example, the pixel defining layer PDL may be formed by using a photoresist, a polyacryl-based resin, a polyimide-based resin, an acryl-based resin, a silicone compound, and the like. According to some example embodiments, the pixel defining layer PDL may be etched to form an opening which partially exposes the first electrode 181. An emission area and a non-emission area of the display apparatus may be defined by the opening of the pixel defining layer PDL. For example, a portion where the opening of the pixel defining layer PDL is located may correspond to the emission area, and the non-emission area may correspond to a portion adjacent to the opening of the pixel defining layer PDL.

The spacer SPC may be located on the pixel defining layer PDL. The spacer SPC may maintain a gap between the touch screen panel layer TSP and the pixel structure 180.

The light emitting layer 182 may be located on the first electrode 181 exposed through the opening of the pixel defining layer PDL. In addition, the light emitting layer 182 may extend onto a side wall of the opening of the pixel defining layer PDL. According to some example embodiments, the light emitting layer 182 may have a multilayer structure including an organic emission layer EL, a hole injection layer HIL, a hole transport layer HTL, an electron transport layer ETL, an electron injection layer EIL, and the like. According to some example embodiments, except for the organic emission layer, the hole injection layer, the hole transport layer, the electron transport layer, the electron injection layer, and the like may be commonly formed to correspond to a plurality of pixels. The organic emission layer of the light emitting layer 182 may be formed by using light emitting materials for generating different color lights such as red light, green light, and blue light according to each of the pixels of the display apparatus. According to some example embodiments, the organic emission layer of the light emitting layer 182 may have a structure in which a plurality of light emitting materials for implementing different color lights such as red light, green light, and blue light are stacked to emit white light. In this case, the above light emitting structures may be commonly formed to correspond to the pixels, and the pixels may be classified by a color filter layer.

The second electrode 183 may be located on the pixel defining layer PDL and the light emitting layer 182. Depending on the light emitting scheme of the display apparatus, the second electrode 183 may include a transmissive material or a reflective material. According to some example embodiments, the second electrode 183 may have a single-layer structure or a multilayer structure including a metal film, an alloy film, a metal nitride film, a conductive metal oxide film, and/or a transparent conductive material film.

The thin film encapsulation layer 190 may be located on the second electrode 183. The thin film encapsulation layer 190 may prevent or reduce moisture, oxygen, or other contaminants penetrating from outside. The thin film encapsulation layer 190 may include at least one organic layer and at least one inorganic layer. The at least one organic layer and the at least one inorganic layer may be alternately stacked on each other. According to some example embodiments, the thin film encapsulation layer 190 may include a first inorganic layer 191, an organic layer 192 located on the first inorganic layer 191, and a second inorganic layer 193 located on the organic layer 192, but embodiments according to the present disclosure are not limited thereto.

The touch screen panel layer TSP may be located on the thin film encapsulation layer 190. The touch screen panel layer TSP may include a touch electrode and an insulating layer, and may be directly formed on the thin film encapsulation layer 190.

Figure 6A:
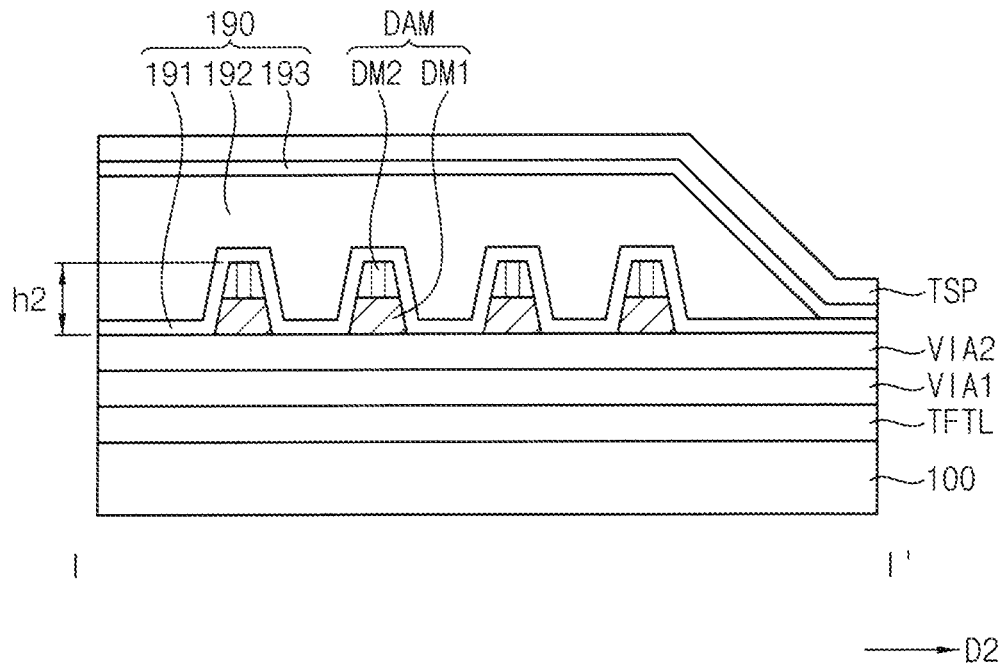
FIG. 6A is a sectional view taken along the line I-I' in FIG. 5.
Figure 6B:
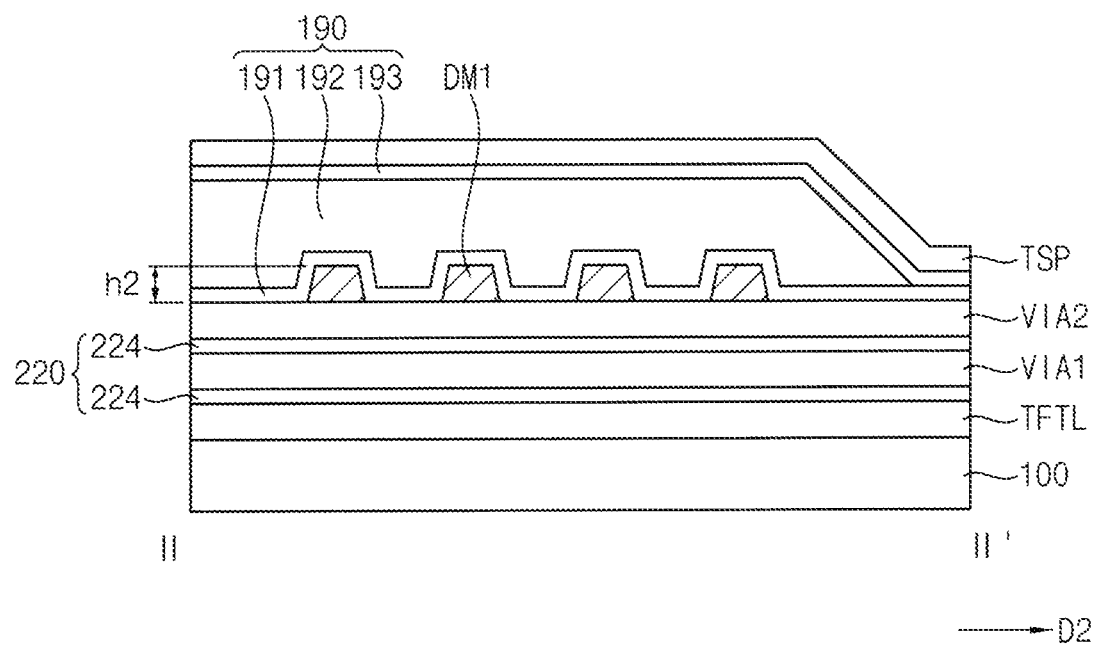
FIG. 6B is a sectional view taken along the line II-II' in FIG. 5.
Figure 6C:
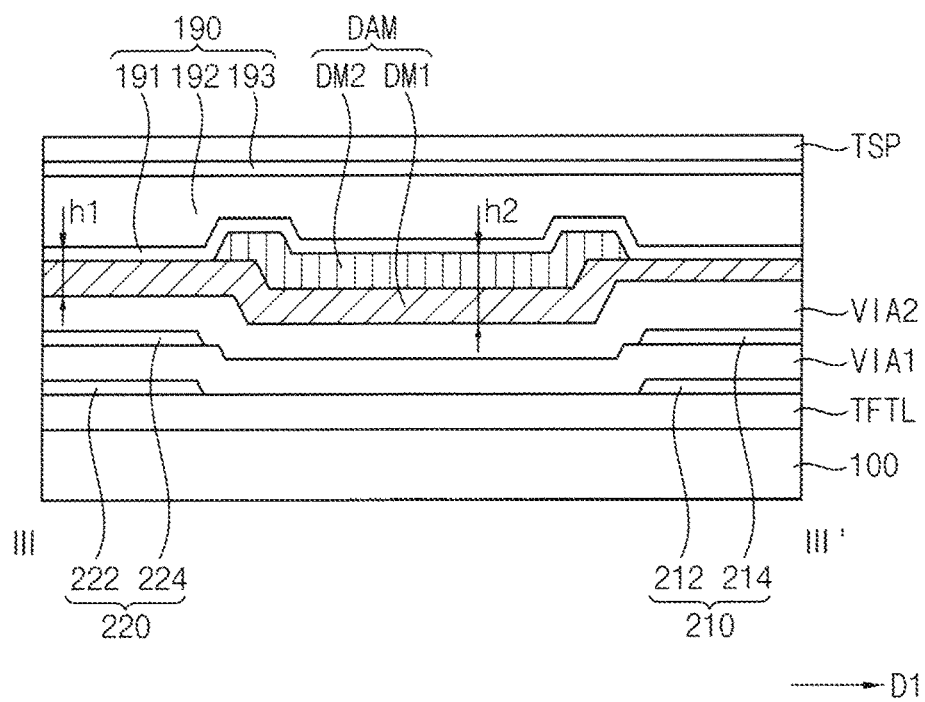
FIG. 6C is a sectional view taken along the line III-Ill' in FIG. 5.

FIG. 5 is an enlarged view showing the area 'A' in FIG. 3, FIG. 6A is a sectional view taken along the line I-I' in FIG. 5, FIG. 6B is a sectional view taken along the line II-II' in FIG. 5, and FIG. 6C is a sectional view taken along the line III-III' in FIG. 5.

Referring to FIGS. 3 to 6C, the display apparatus may include the base substrate 100, a thin film transistor layer TFTL, the first power supply wire 210, the second power supply wire 220, the first via insulating layer VIA1, the second via insulating layer VIA2, a dam DAM, the thin film encapsulation layer 190, and the touch screen panel layer TSP.

The thin film transistor layer TFTL may include the thin film transistor TFT and insulating layers (e.g., the buffer layer 110, the first insulating layer 120, and the second insulating layer 130).

The first power supply wire 210 may include a first layer 212 and a second layer 214. The second power supply wire 220 may include a first layer 222 and a second layer 224. The first layer 212 of the first power supply wire 210 and the first layer 222 of the second power supply wire 220 may be included in the first source-drain conductive layer. The second layer 214 of the first power supply wire 210 and the second layer 224 of the second power supply wire 220 may be included in the second source-drain conductive layer.

Depending on the presence or absence of the first power supply wire 210 and the second power supply wire 220, the first via insulating layer VIA1 and the second via insulating layer VIA2 may be recessed in a region between the first power supply wire 210 and the second power supply wire 220 than in a portion where the first power supply wire 210 and the second power supply wire 220 are formed. In other words, a height from the base substrate 100 to a top surface of the second via insulating layer VIA2 may be lower in the region between the first power supply wire 210 and the second power supply wire 220 than in a region overlapping the first or second power supply wire 210 or 220.

The dam DAM may be formed on the second via insulating layer VIA2. The dam DAM may surround the display area DA of the display apparatus, and may overlap the first power supply wire 210 and the second power supply wire 220. In other words, the dam DAM may extend in the first direction D1 at a portion where the first power supply wire 210 and the second power supply wire 220 extend in the second direction D2. The dam DAM may be configured to prevent or reduce overflow by controlling a flow of an organic material when the organic layer 192 of the thin film encapsulation layer 190 is formed.

A plurality of dams DAM may be arranged in the second direction D2. Although four dams DAM, each extending in the first direction D1, are shown in the drawings as being arranged in the second direction D2, the embodiments according to the present disclosure are not limited thereto.

The dam DAM may include a first dam layer DM1 and a second dam layer DM2. The first dam layer DM1 may be located in a region overlapping the first power supply wire 210 and the second power supply wire 220, and the region between the first power supply wire 210 and the second power supply wire 220. The first dam layer DAM1 may be, for example, formed on the same layer as the pixel defining layer PDL.

The second dam layer DM2 may be located on the first dam layer DM1 in the region between the first power supply wire 210 and the second power supply wire 220. Accordingly, the dam DAM may have a first height h1 on the first power supply wire 210 and the second power supply wire 220, and may have a second height h2 greater than the first height h1 between the first power supply wire 210 and the second power supply wire 220. Both ends of the second dam layer DM2 of the dam DAM may overlap the first power supply wire 210 and the second power supply wire 220.

The second dam layer DM2 may be, for example, formed on the same layer as the spacer SPC. According to some example embodiments, the dam DAM may be formed on one layer so as to include two portions having different heights by using a halftone mask or the like.

Figure 7:
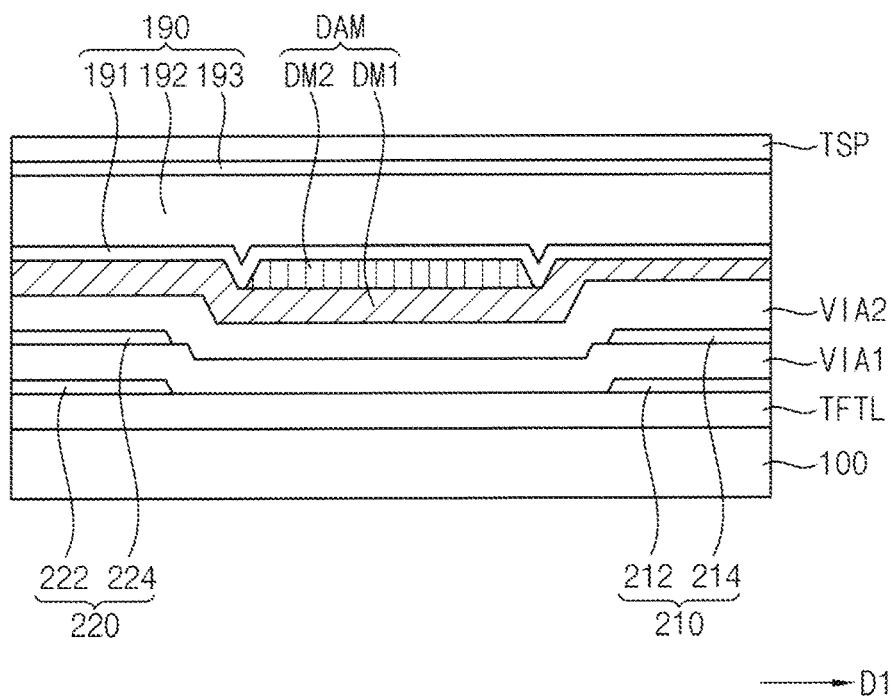
FIG. 7 is a sectional view showing a display apparatus according to some example embodiments.

FIG. 7 is a sectional view showing a display apparatus according to some example embodiments.

Referring to FIG. 7, a display apparatus is substantially the same as the display apparatus of FIG. 6C except that the second dam layer DM2 is formed only between the first power supply wire 210 and the second power supply wire 220 so that the both ends of the second dam layer DM2 of the dam DAM may not overlap the first power supply wire 210 and the second power supply wire 220. Therefore, some redundant descriptions thereof may be omitted.

FIG. 8 is a partially enlarged view showing a display apparatus according to some example embodiments, FIG.

Figure 9A:
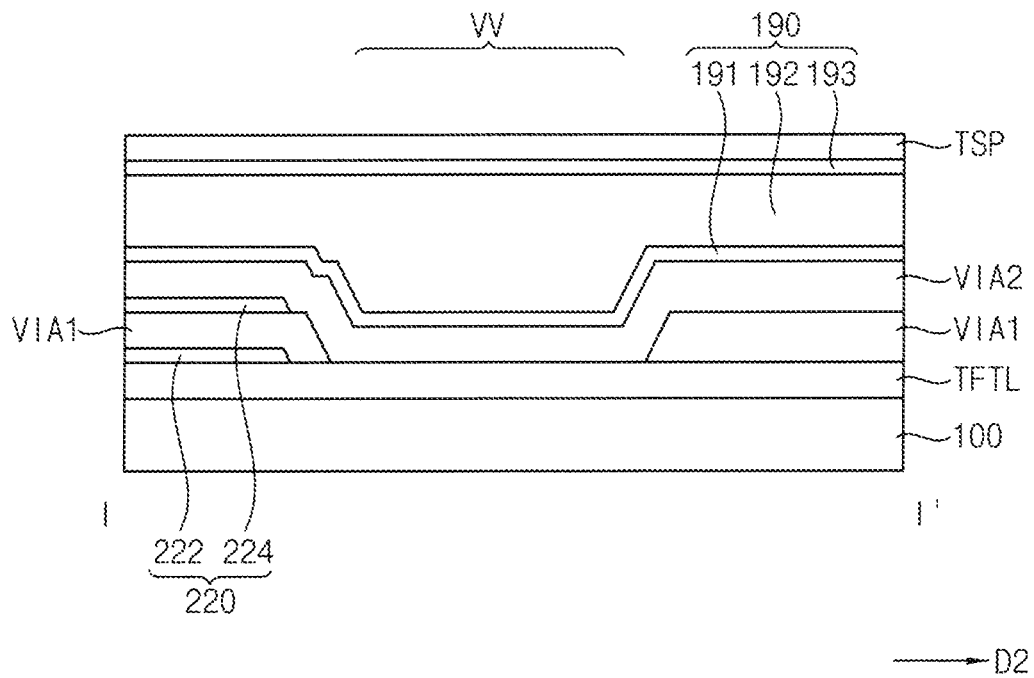
FIG. 9A is a sectional view taken along the line I-I' in FIG. 8.
Figure 9B:
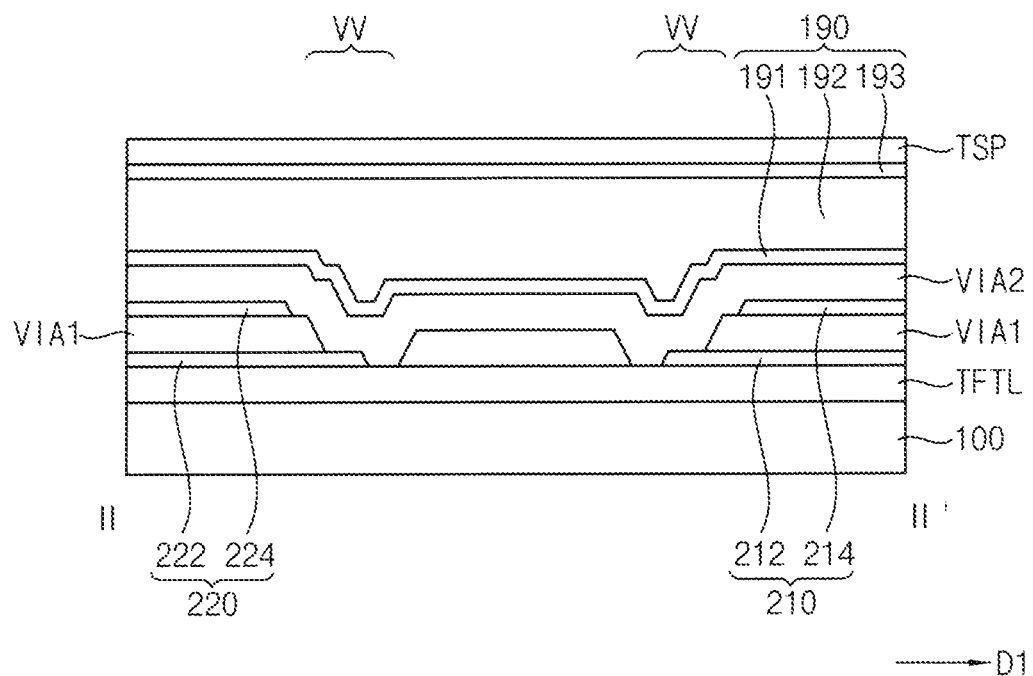
FIG. 9B is a sectional view taken along the line II-II' in FIG. 8.

9A is a sectional view taken along the line I-I' in FIG. 8, and FIG. 9B is a sectional view taken along the line II-II' in FIG. 8.

Referring to FIGS. 8 to 9B, a display apparatus is substantially the same as the display apparatus of FIGS. 4 to 6C except that a recessed portion VV is formed. Therefore, some redundant descriptions thereof may be omitted.

The display apparatus may include a base substrate 100, a thin film transistor layer TFTL, a first source-drain conductive layer, a first via insulating layer VIA1, a second source-drain conductive layer, a second via insulating layer VIA2, a thin film encapsulation layer 190, and a touch screen panel layer TSP. The first source-drain conductive layer may include a first layer 212 of a first power supply wire 210 and a first layer 222 of a second power supply wire 220. The second source-drain conductive layer may include a second layer 214 of the first power supply wire 210 and a second layer 224 of the second power supply wire 220. The thin film encapsulation layer 190 may include a first inorganic layer 191, an organic layer 192, and a second inorganic layer 193.

The recessed portion VV may be formed in the second via insulating layer VIA2. The recessed portion VV may be formed between the first power supply wire and the second power supply wire.

The recessed portion VV may include a first portion VV1 at least partially overlapping the first power supply wire 210, and a second portion VV2 at least partially overlapping the second power supply wire 220.

The first portion VV1 and the second portion VV2 of the recessed portion may extend in directions inclined with respect to the first direction D1 and the second direction D2, respectively. In other words, as illustrated in FIG. 8, the first portion VV1 may extend obliquely in a left-downward direction, and the second portion VV2 may extend obliquely in a right-downward direction.

The recessed portion VV may further include a third portion VV3 configured to connect the first portion VV1 to the second portion VV2 and extending in the first direction D1.

In the recessed portion VV, all or a part of the first via insulating layer VIA1 or the second via insulating layer VIA2 may not be formed. According to some example embodiments, the first via insulating layer VIA1 may not be formed by a patterning process in the recessed portion VV.

Accordingly, a height from a top surface of the thin film transistor layer TFTL to the top surface of the second via insulating layer VIA2 in which the recessed portion VV is formed may be lower in the region between the first power supply wire 210 and the second power supply wire 220 than in the region overlapping the first or second power supply wire 210 or 220.

Meanwhile, according to some example embodiments, the display apparatus may further include a dam DAM as in the display apparatus of FIG. 5.

Figure 10:
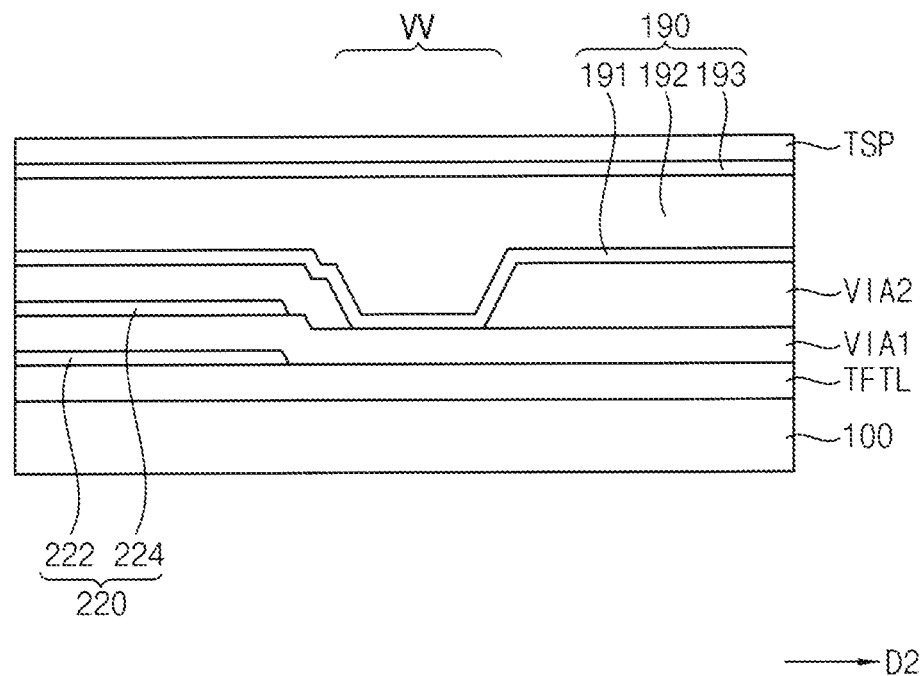
FIG. 10 is a sectional view showing a display apparatus according to some example embodiments.

FIG. 10 is a sectional view showing a display apparatus according to some example embodiments.

Referring to FIG. 10, a display apparatus is substantially the same as the display apparatus of FIG. 9A except that the second via insulating layer VIA2 is removed by the patterning in the recessed portion VV instead of removing the first via insulating layer VIA1 by the patterning. Therefore, some redundant descriptions thereof may be omitted.

Figure 11:
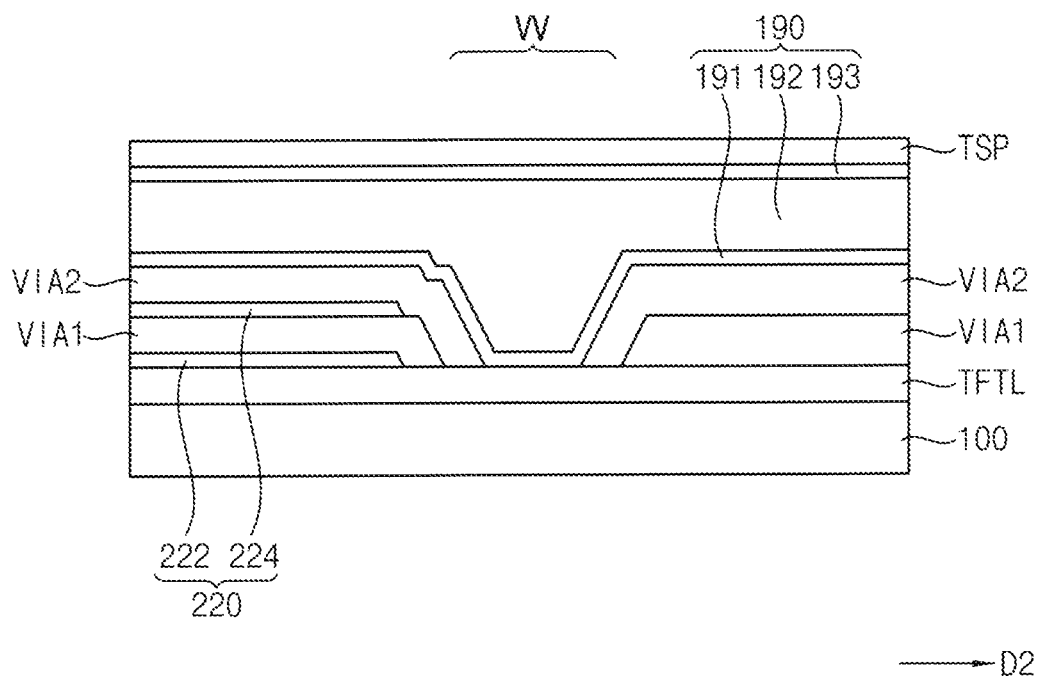
FIG. 11 is a sectional view showing a display apparatus according to some example embodiments.

FIG. 11 is a sectional view showing a display apparatus according to some example embodiments.

Referring to FIG. 11, a display apparatus is substantially the same as the display apparatus of FIG. 9A except that both the first via insulating layer VIA1 and the second via insulating layer VIA2 are removed by the patterning in the recessed portion VV. Therefore, some redundant descriptions thereof may be omitted.

Figure 12:
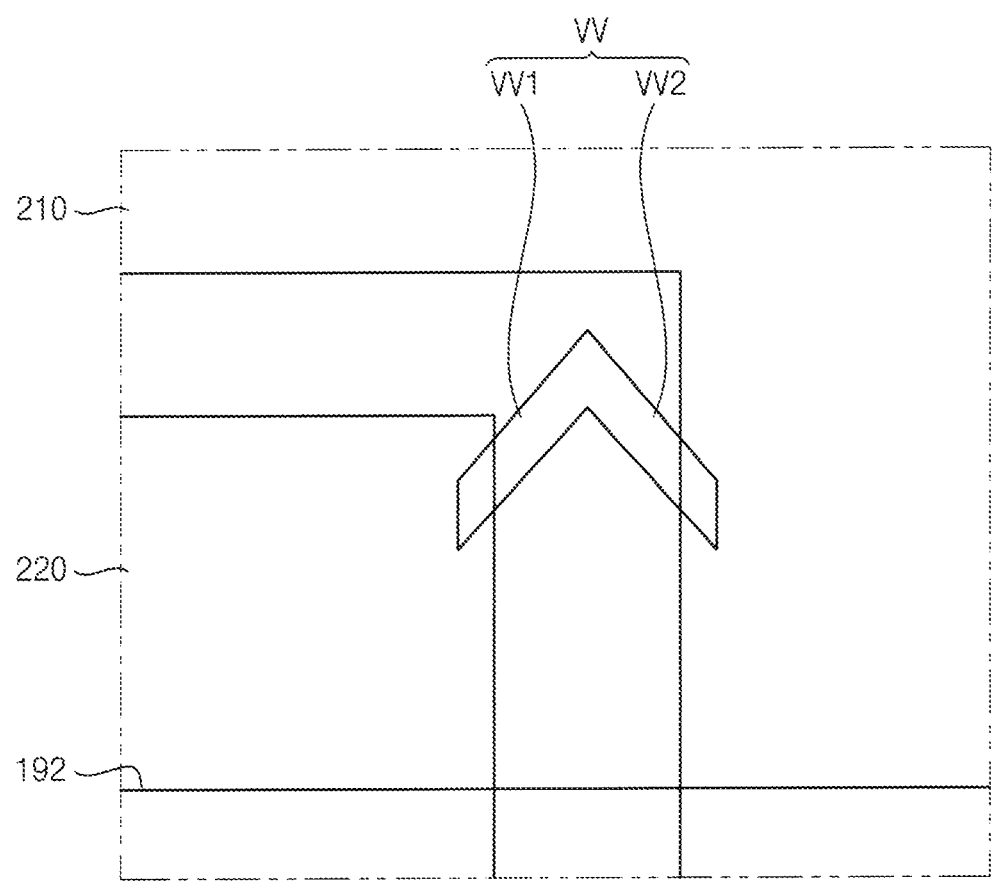
FIG. 12 is a partially enlarged view showing a display apparatus according to some example embodiments.

FIG. 12 is a partially enlarged view showing a display apparatus according to some example embodiments.

Referring to FIG. 12, a display apparatus is substantially the same as the display apparatus of FIG. 8 except that the recessed portion VV does not include the third portion, and the first portion and the second portion are directly connected to each other so as to form a V-shape as a whole. Therefore, some redundant descriptions thereof may be omitted.

FIG. 13 is a partially enlarged view showing a display apparatus according to some example embodiments.

Referring to FIG. 13, a display apparatus is substantially the same as the display apparatus of FIG. 8 except for a shape of the recessed portion VV. Therefore, some redundant descriptions thereof may be omitted.

The recessed portion VV may extend in the second direction D2 between the first power supply wire 210 and the second power supply wire 220.

Figure 14A:
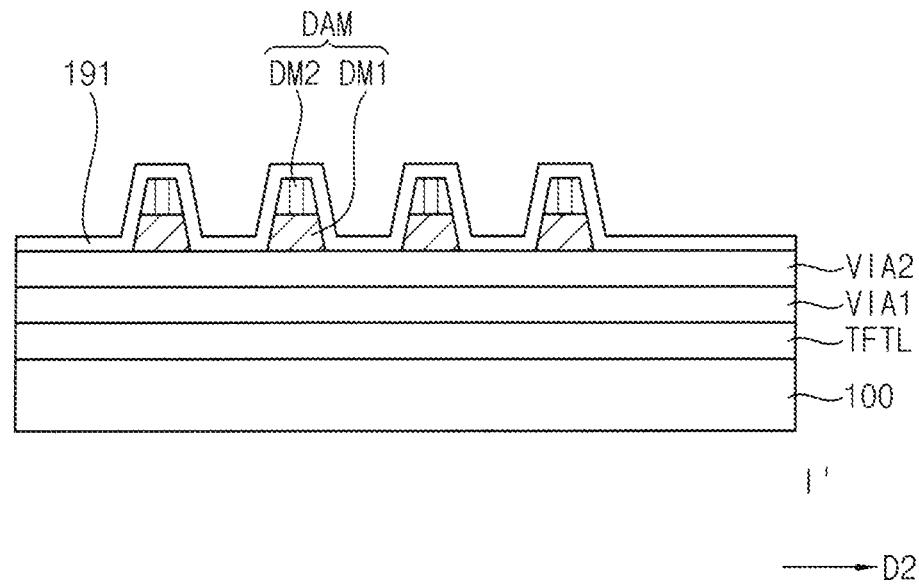
FIGS. 14A to 14C are sectional views showing a method of manufacturing a display apparatus according to some example embodiments.
Figure 14B:
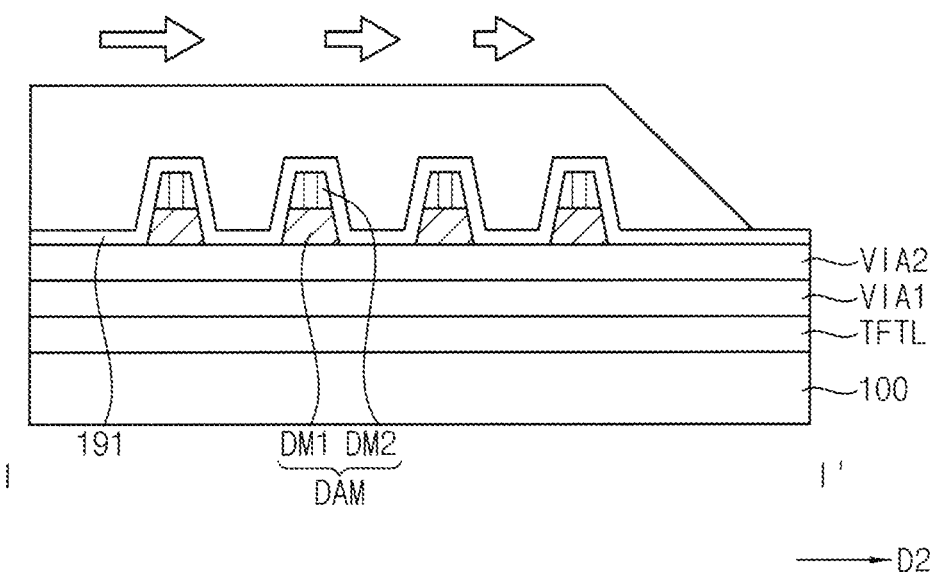
Figure 14C:
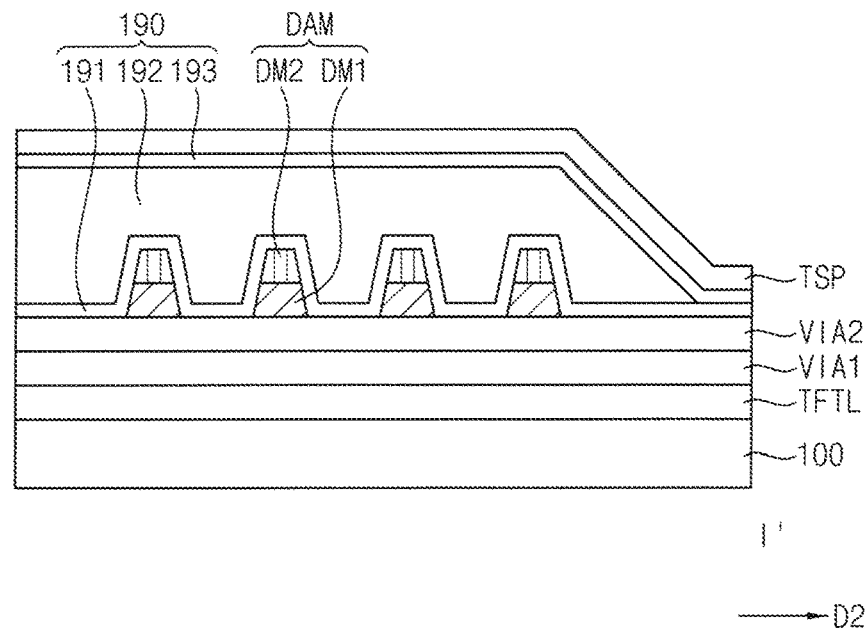

FIGS. 14A to 14C are sectional views showing a method of manufacturing a display apparatus according to some example embodiments.

Referring to FIG. 14A, the thin film transistor layer TFTL, the first source-drain conductive layer, the first via insulating layer VIA1, the second source-drain conductive layer, and the second via insulating layer VIA2 may be formed on the base substrate 100. Then, the dam DAM may be formed by forming the first dam layer DM1 and the second dam layer DM2. Thereafter, the first inorganic layer 191 of the thin film encapsulation layer may be formed.

Referring to FIG. 14B, the organic layer 192 may be formed on the first inorganic layer 191. The organic layer 192 may be formed of a monomer which is an organic compound. For example, the organic layer 192 may include methacrylate, acrylate, epoxy, or the like. The monomer in a liquid state may be formed through a printing process and the like. In this case, the printing process may include inkjet printing, screen printing, gravure printing, offset printing, flexo printing, and the like, but the embodiments according to the present disclosure are not limited thereto.

In this case, the monomer in the liquid state may flow and spread in directions of arrows in the drawing. At this time, an excessive flow may be controlled by the dam DAM. For example, the dam DAM may overlap the first power supply wire (see 210 in FIG. 5) and the second power supply wire (see 220 in FIG. 5), may have the first height on the first power supply wire, and may have the second height greater than the first height between the first power supply wire and the second power supply wire. Accordingly, the monomer may be prevented from overflowing beyond a desired position as the flow is concentrated in the region between the first power supply wire and the second power supply wire, in which the top surface of the second via insulating layer VIA2 has a relatively low height. Thereafter, the monomer may be cured to form the organic layer 192.

Referring to FIG. 14C, the second inorganic layer 193 may be formed on the organic layer 192. Then, the touch screen panel layer TSP including the touch electrode may be formed on the second inorganic layer 193. For example, after the touch electrode is directly formed on the second inorganic layer through a deposition process, an insulating layer may be formed to form the touch screen panel layer TSP. In this case, because the organic layer 192 is uniformly formed by the dam DAM, an interval between the touch screen panel layer TSP, and the thin film transistor layer TFTL and the first and second source-drain conductive layers may be uniformly maintained, so that a parasitic capacitance between the touch screen panel layer TSP and other conductive patterns may be easily controlled, and uniformity of a surface on which the touch screen panel layer TSP is formed may be easily ensured.

Figure 15:
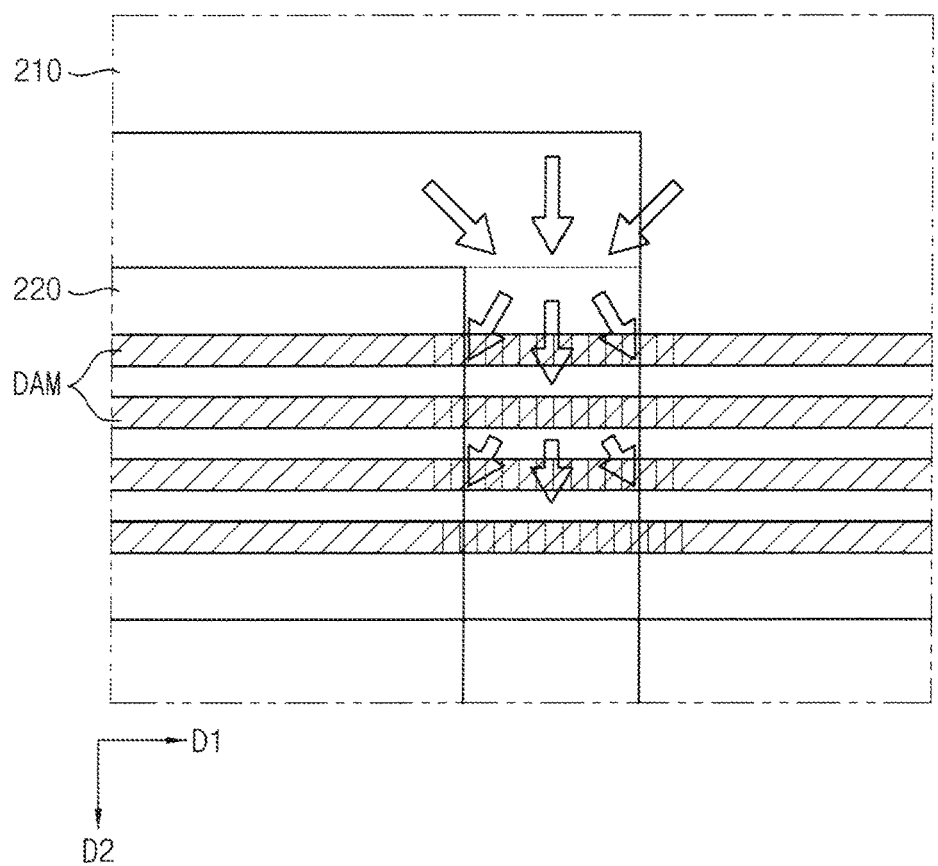
FIG. 15 is a diagram illustrating a flow of an organic layer of a thin film encapsulation layer of the display apparatus of FIG. 5.
Figure 16:
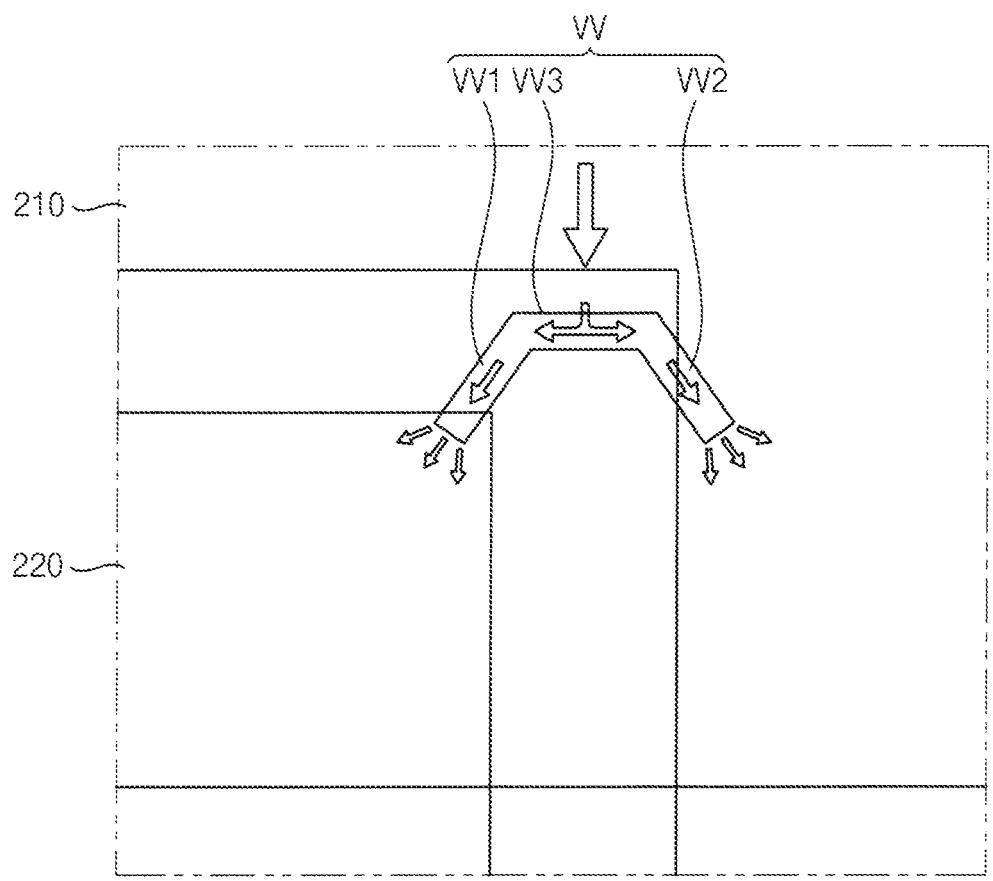
FIG. 16 is a diagram illustrating a flow of an organic layer of a thin film encapsulation layer of the display apparatus of FIG. 8.
Figure 18:
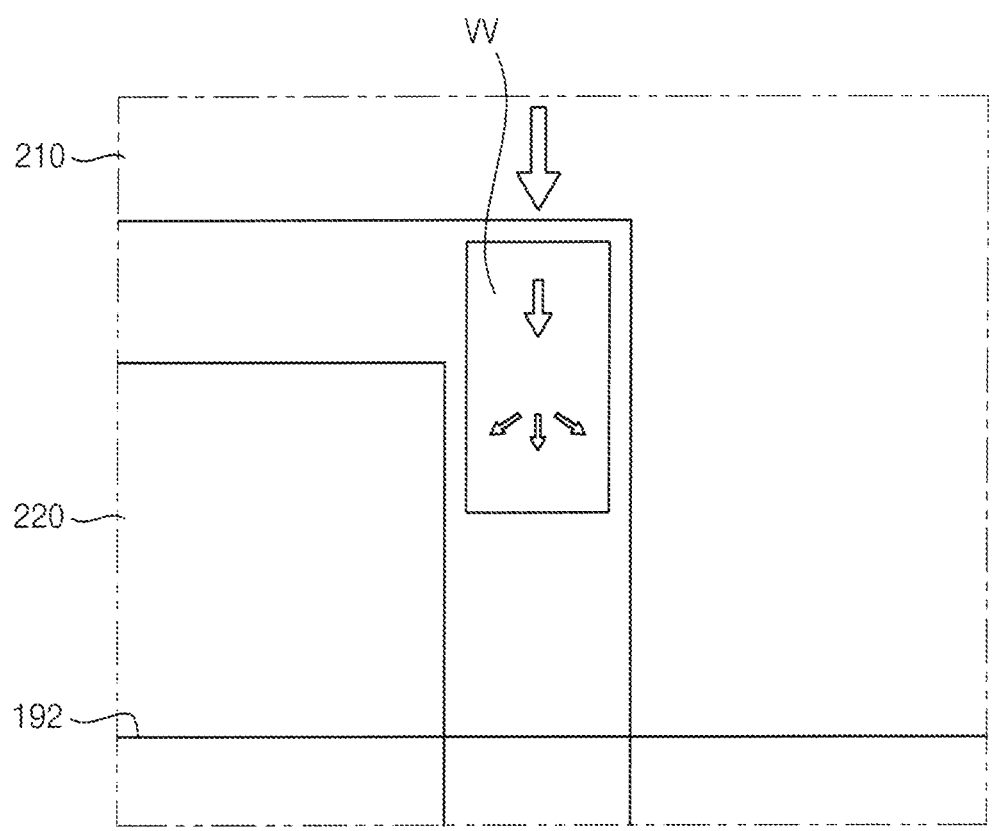
FIG. 18 is a diagram illustrating a flow of an organic layer of a thin film encapsulation layer of the display apparatus of FIG. 13.

FIG. 15 is a diagram illustrating a flow of an organic layer of a thin film encapsulation layer of the display apparatus of FIG. 5, FIG. 16 is a diagram illustrating a flow of an organic layer of a thin film encapsulation layer of the display apparatus of FIG. 8, FIG. 17 is a diagram illustrating a flow of an organic layer of a thin film encapsulation layer of the display apparatus of FIG. 12, and FIG. 18 is a diagram illustrating a flow of an organic layer of a thin film encapsulation layer of the display apparatus of FIG. 13.

Referring to FIGS. 15 to 18, it can be seen that due to the dam DAM or the recessed portion VV, a flow of the organic layer is dispersed to peripheries without being concentrated in the region between the first power supply wire 210 and the second power supply wire 220, in which the top surface of the second via insulating layer has a relatively low height, so that the organic layer is prevented from overflowing beyond a desired position.

Meanwhile, when the dam DAM or the recessed portion VV is not formed, the flow may be concentrated in the region between the first power supply wire 210 and the second power supply wire 220 due to a step difference, so that an overflow problem of the organic layer may occur. When such a problem occurs, the organic layer may not be uniformly formed, so that it may be difficult to uniformly form the touch screen panel layer, the parasitic capacitance of the touch screen panel layer may not be easily controlled, and moisture and the like may penetrate into the light emitting layer in the display area through the overflowed organic layer so as to cause damage to the light emitting layer.

Figure 19:
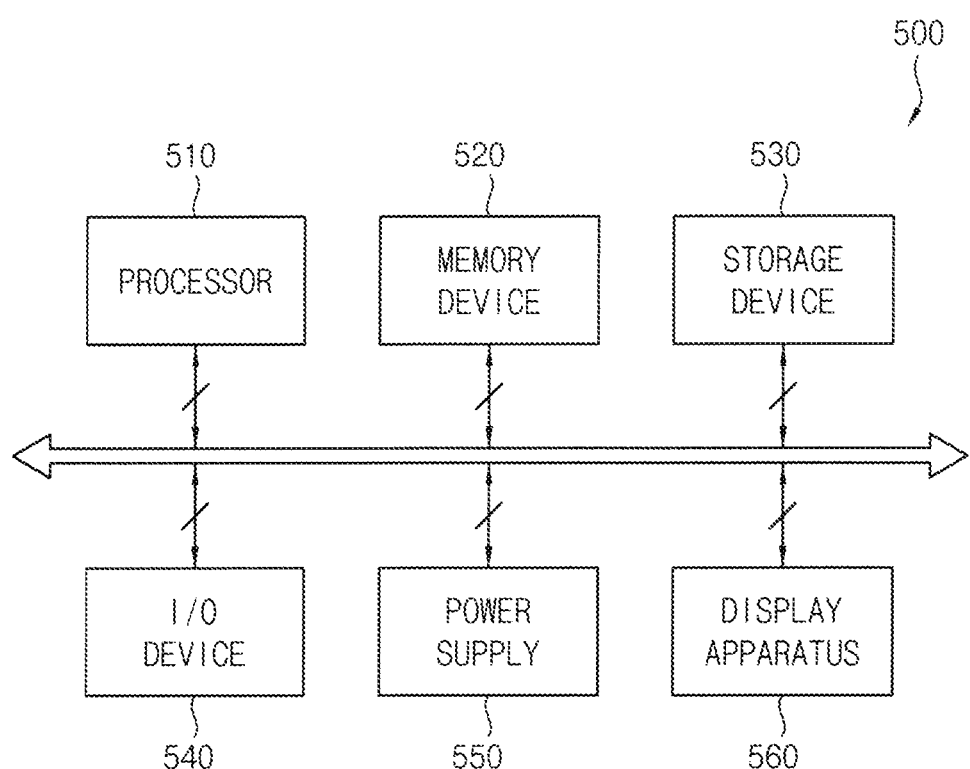
FIG. 19 is a block diagram illustrating an electronic device according to some example embodiments.
Figure 20A:
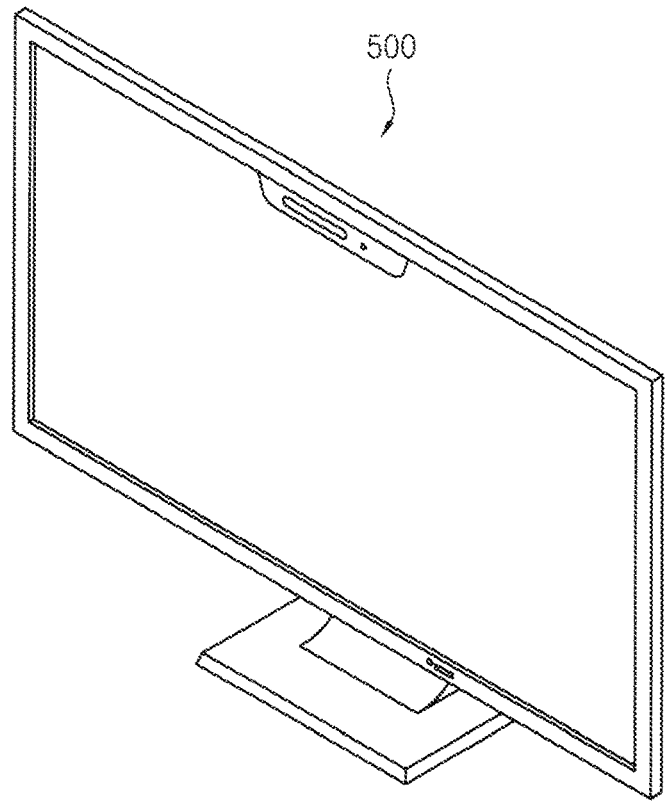
FIG. 20A is a diagram illustrating an example in which the electronic device of FIG. 19 is implemented as a television.
Figure 20B:
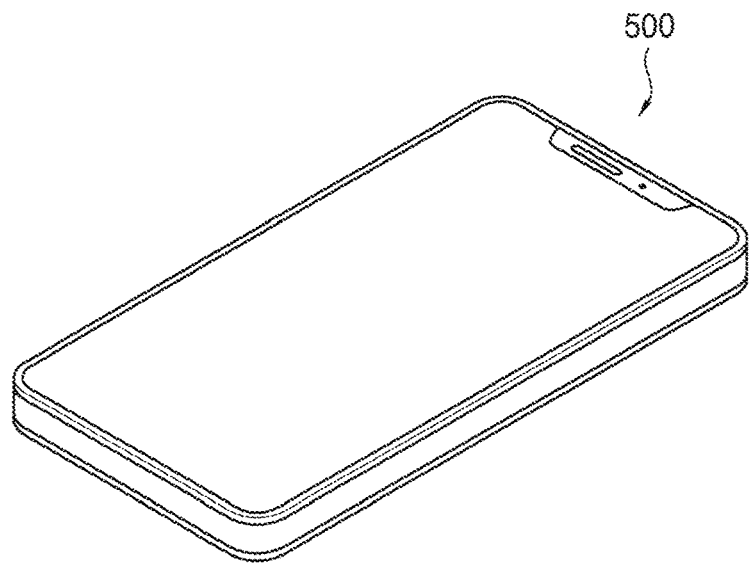
FIG. 20B is a diagram illustrating an example in which the electronic device of FIG. 19 is implemented as a smart phone.

FIG. 19 is a block diagram illustrating an electronic device according to some example embodiments, FIG. 20A is a diagram illustrating an example in which the electronic device of FIG. 19 is implemented as a television, and FIG. 20B is a diagram illustrating an example in which the electronic device of FIG. 19 is implemented as a smart phone.

Referring to FIGS. 19 to 20B, the electronic device 500 may include a processor 510, a memory device 520, a storage device 530, an input/output (I/O) device 540, a power supply 550, and a display apparatus 560. Here, the display apparatus 560 may be the display apparatus of FIG. 1. In addition, the electronic device 500 may further include a plurality of ports for communicating with a video card, a sound card, a memory card, a universal serial bus (USB) device, other electronic devices, etc. According to some example embodiments, as illustrated in FIG. 20A, the electronic device 500 may be implemented as a television. According to some example embodiments, as illustrated in FIG. 20B, the electronic device 500 may be implemented as a smart phone. However, the electronic device 500 is not limited thereto. For example, the electronic device 500 may be implemented as a cellular phone, a video phone, a smart pad, a smart watch, a tablet PC, a car navigation system, a computer monitor, a laptop, a head mounted display (HMD) apparatus, etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic device 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc and/or at least one volatile memory device such as a dynamic random access memory (DRAM) device, a static random access memory (SRAM) device, a mobile DRAM device, etc. The storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc, and an output device such as a printer, a speaker, etc. The power supply 550 may provide power for operations of the electronic device 500.

The display apparatus 560 may be coupled to other components via the buses or other communication links. According to some example embodiments, the I/O device 540 may include the display apparatus 560. As described above, the display apparatus 560 includes a dam overlapping a first power supply wire and a second power supply wire, having a first height on the first power supply wire, and having a second height greater than the first height between the first power supply wire and the second power supply wire, or includes an insulating layer having a recessed portion formed between the first power supply wire and the second power supply wire. Accordingly, an organic layer of the thin film encapsulation layer may be uniformly formed, so that the display quality and the quality of the touch screen panel layer can be improved. Because certain characteristics are described above, some duplicated description related thereto may not be repeated.

Aspects of some example embodiments of the present inventive concept may be applied to a display apparatus and an electronic device including the display apparatus. For example, embodiments according to the present inventive concept may be applied to a smart phone, a cellular phone, a video phone, a smart pad, a smart watch, a tablet PC, a car navigation system, a television, a computer monitor, a laptop, a head mounted display apparatus, etc.

The foregoing is illustrative of some example embodiments and is not to be construed as limiting thereof. Although aspects of some example embodiments have been described, those skilled in the art will readily appreciate that many modifications are possible in the embodiments without materially departing from the novel teachings and characteristics of embodiments according to the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed embodiments, as well as other embodiments, are intended to be included within the scope of the appended claims, and their equivalents.

What is claimed is:

1. A display apparatus comprising:
a base substrate including a display area and a non-display area adjacent to the display area;
a first power supply wire in the non-display area, a first power supply voltage being applied to the first power supply wire;
a second power supply wire in the non-display area and spaced apart from the first power supply wire, a second power supply voltage being applied to the second power supply wire;
a dam overlapping the first power supply wire and the second power supply wire, having a first height on the first power supply wire, and having a second height greater than the first height between the first power supply wire and the second power supply wire;
a pixel defining layer on the base substrate to define an opening;
a light emitting layer in the opening; and
a thin film encapsulation layer on the light emitting layer,
wherein the dam includes a first dam layer and a second dam layer on the first dam layer,
wherein the first dam layer is formed between the first power supply wire and the second power supply wire, and on the first power supply wire and the second power supply wire,
wherein the second dam layer is formed between the first power supply wire and the second power supply wire, and
wherein the first dam layer of the dam is on a same layer as the pixel defining layer.

2. The display apparatus of claim 1, wherein both ends of the second dam layer of the dam overlap the first power supply wire and the second power supply wire.

3. The display apparatus of claim 1, further comprising:
a spacer on the pixel defining layer,
wherein the second dam layer of the dam is on a same layer as the spacer.

4. The display apparatus of claim 1, further comprising:
a via insulating layer on the first power supply wire and the second power supply wire,
wherein a height from the base substrate to a top surface of the via insulating layer is lower in a region between the first power supply wire and the second power supply wire than in a region overlapping the first or second power supply wire.

5. The display apparatus of claim 1, wherein each of the first power supply wire and the second power supply wire includes at least two conductive layers, and an insulating layer is between the conductive layers.

6. The display apparatus of claim 1, further comprising:
a first inorganic layer on the dam;
an organic layer on the first inorganic layer; and
a second inorganic layer on the organic layer.

7. The display apparatus of claim 1, further comprising:
a via insulating layer having a recessed portion between the first power supply wire and the second power supply wire.

8. The display apparatus of claim 1, further comprising:
a thin film transistor layer on the base substrate and including a thin film transistor;
a light emitting structure electrically connected to the thin film transistor;
a thin film encapsulation layer which covers the light emitting structure; and
a touch screen panel layer on the thin film encapsulation layer to detect a touch input of a user.

9. A display apparatus comprising:
a base substrate including a display area and a non-display area adjacent to the display area;
a first power supply wire in the non-display area, a first power supply voltage being applied to the first power supply wire;
a second power supply wire in the non-display area and spaced apart from the first power supply wire, a second power supply voltage being applied to the second power supply wire; and
an insulating layer having a recessed portion between the first power supply wire and the second power supply wire,
wherein the insulating layer includes:
a first via insulating layer; and
a second via insulating layer on the first via insulating layer, and
wherein at least one of the first via insulating layer and the second via insulating layer is not formed in the recessed portion.

10. The display apparatus of claim 9, wherein the recessed portion includes a first portion at least partially overlapping the first power supply wire and a second portion at least partially overlapping the second power supply wire.

11. The display apparatus of claim 10, wherein the first power supply wire and the second power supply wire are spaced apart from each other in a first direction and extend in a second direction perpendicular to the first direction, and
wherein the first portion and the second portion of the recessed portion extend in directions inclined with respect to the first direction and the second direction, respectively.

12. The display apparatus of claim 9, wherein the first power supply wire and the second power supply wire are spaced apart from each other in a first direction and extend in a second direction perpendicular to the first direction, and
wherein the recessed portion extends in the second direction between the first power supply wire and the second power supply wire.

13. The display apparatus of claim 9, further comprising:
a thin film transistor layer on the base substrate and including a thin film transistor,
wherein a height from a top surface of the thin film transistor layer to a top surface of the insulating layer in which the recessed portion is formed is lower in a region between the first power supply wire and the second power supply wire than in a region overlapping the first or second power supply wire.

14. The display apparatus of claim 9, further comprising:
a first inorganic layer on the insulating layer;
an organic layer on the first inorganic layer; and
a second inorganic layer on the organic layer.

15. The display apparatus of claim 9, further comprising:
a thin film transistor layer on the base substrate and including a thin film transistor;
a light emitting structure electrically connected to the thin film transistor;
a thin film encapsulation layer which covers the light emitting structure; and
a touch screen panel layer on the thin film encapsulation layer to detect a touch input of a user.

16. The display apparatus of claim 9, further comprising:
a dam on the insulating layer to overlap the first power supply wire and the second power supply wire.

17. The display apparatus of claim 16, wherein the dam has a first height on the first power supply wire, and has a second height greater than the first height between the first power supply wire and the second power supply wire.

\* \* \* \* \*